United States Patent
Chiu et al.

(10) Patent No.: US 12,438,118 B2
(45) Date of Patent: *Oct. 7, 2025

(54) BONDING TOOL AND BONDING METHOD THEREOF

(71) Applicant: TAIWAN SEMICONDUCTOR MANUFACTURING COMPANY LTD., Hsinchu (TW)

(72) Inventors: Chih-Yuan Chiu, Hsinchu County (TW); Shih-Yen Chen, Hsinchu (TW); Chi-Chun Peng, Hsinchu (TW); Hong-Kun Chen, Hsinchu (TW); Hui-Ting Lin, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/654,016

(22) Filed: May 3, 2024

(65) Prior Publication Data

US 2024/0297143 A1 Sep. 5, 2024

Related U.S. Application Data

(63) Continuation of application No. 17/672,285, filed on Feb. 15, 2022, now Pat. No. 12,009,337.
(Continued)

(51) Int. Cl.
*H01L 23/00* (2006.01)
*H01L 21/683* (2006.01)

(52) U.S. Cl.
CPC .......... *H01L 24/74* (2013.01); *H01L 21/6838* (2013.01); *H01L 24/80* (2013.01); *H01L 2224/08145* (2013.01); *H01L 2224/80047* (2013.01); *H01L 2224/80132* (2013.01); *H01L 2224/80201* (2013.01); *H01L 2224/80894* (2013.01); *H01L 2224/80908* (2013.01)

(58) Field of Classification Search
CPC ..... H01L 24/74; H01L 24/80; H01L 21/6838; H01L 2224/08145; H01L 2224/80047; H01L 2224/80132; H01L 2224/80201; H01L 2224/80894; H01L 2224/80908
See application file for complete search history.

(56) References Cited

U.S. PATENT DOCUMENTS 7,682,933 B1 * 3/2010 Loomis ............... H01L 25/50
438/455
9,263,268 B2 * 2/2016 Yamamoto ............. H01L 21/68
(Continued)

*Primary Examiner* — David A Zarneke
(74) *Attorney, Agent, or Firm* — WPAT LAW; Anthony King

(57) ABSTRACT

A bonding tool and a bonding method are provided. The method includes attaching a semiconductor die to a bonding tool having a first surface, wherein the bonding tool comprises a bending member movably arranged in a trench of the bonding tool, and the bending member protrudes from the first surface and bends the semiconductor die; moving the semiconductor die toward a semiconductor wafer to cause a retraction of the bending member and a partial bonding at a portion of the semiconductor die and the semiconductor wafer; and causing a full bonding between the semiconductor die and the semiconductor wafer subsequent to the partial bonding.

20 Claims, 25 Drawing Sheets

Related U.S. Application Data

(60) Provisional application No. 63/227,805, filed on Jul. 30, 2021.

(56) References Cited

U.S. PATENT DOCUMENTS

| | | | | |
|---|---|---|---|---|
| 9,412,629 | B2* | 8/2016 | Nguyen | H01L 24/74 |
| 10,580,752 | B2* | 3/2020 | Yamauchi | B23K 37/047 |
| 10,923,452 | B2* | 2/2021 | Han | H01L 21/687 |
| 10,964,560 | B2* | 3/2021 | Choi | H01L 21/6875 |
| 12,009,337 | B2* | 6/2024 | Chiu | H01L 21/6838 |
| 2007/0287264 | A1* | 12/2007 | Rogers | H01L 21/187 |
| | | | | 257/E23.179 |
| 2020/0013643 | A1* | 1/2020 | Kim | H01L 21/6838 |
| 2023/0163094 | A1* | 5/2023 | Choi | H01L 24/80 |
| | | | | 228/3.1 |
| 2023/0207514 | A1* | 6/2023 | Gao | H01L 24/74 |
| | | | | 438/107 |

* cited by examiner

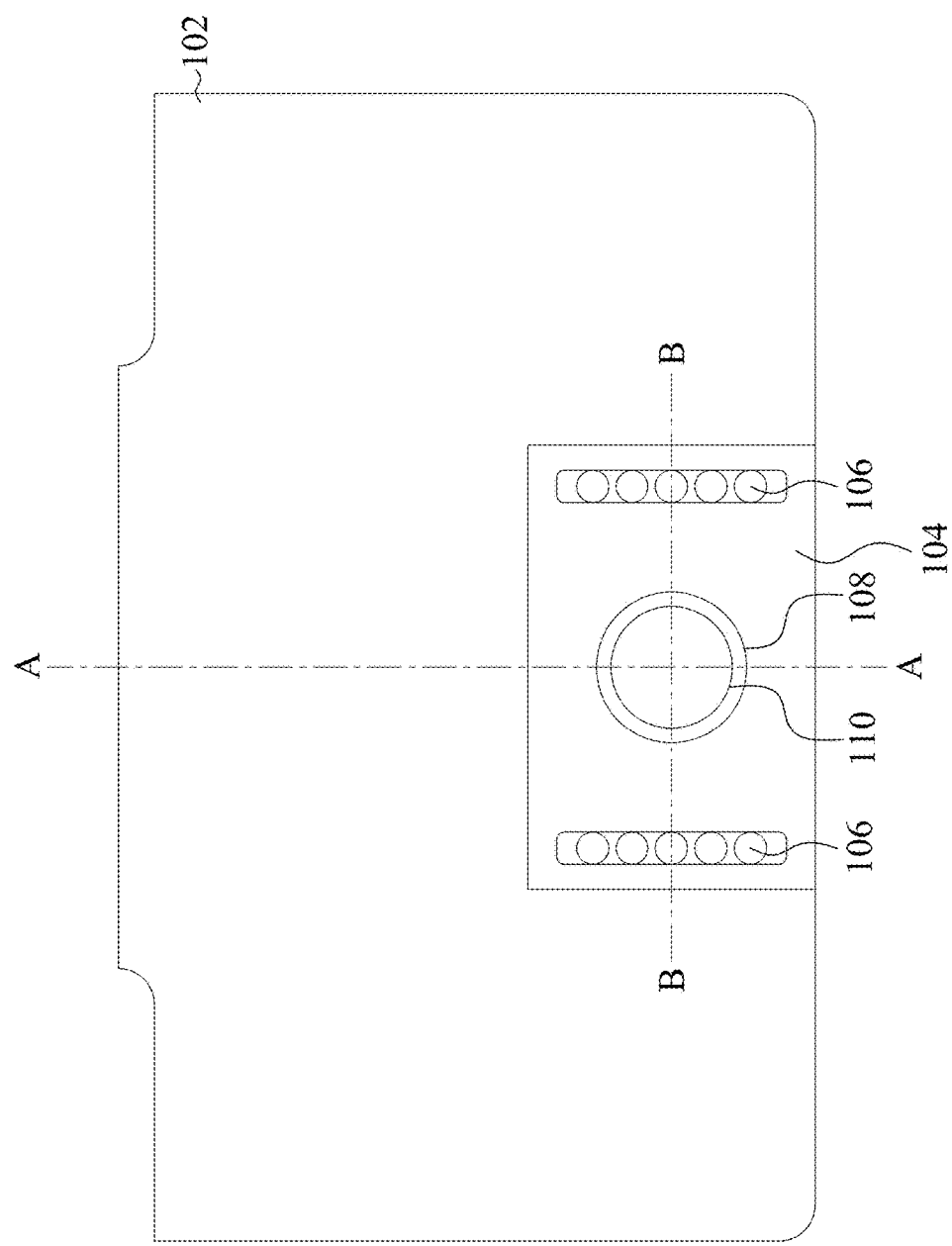

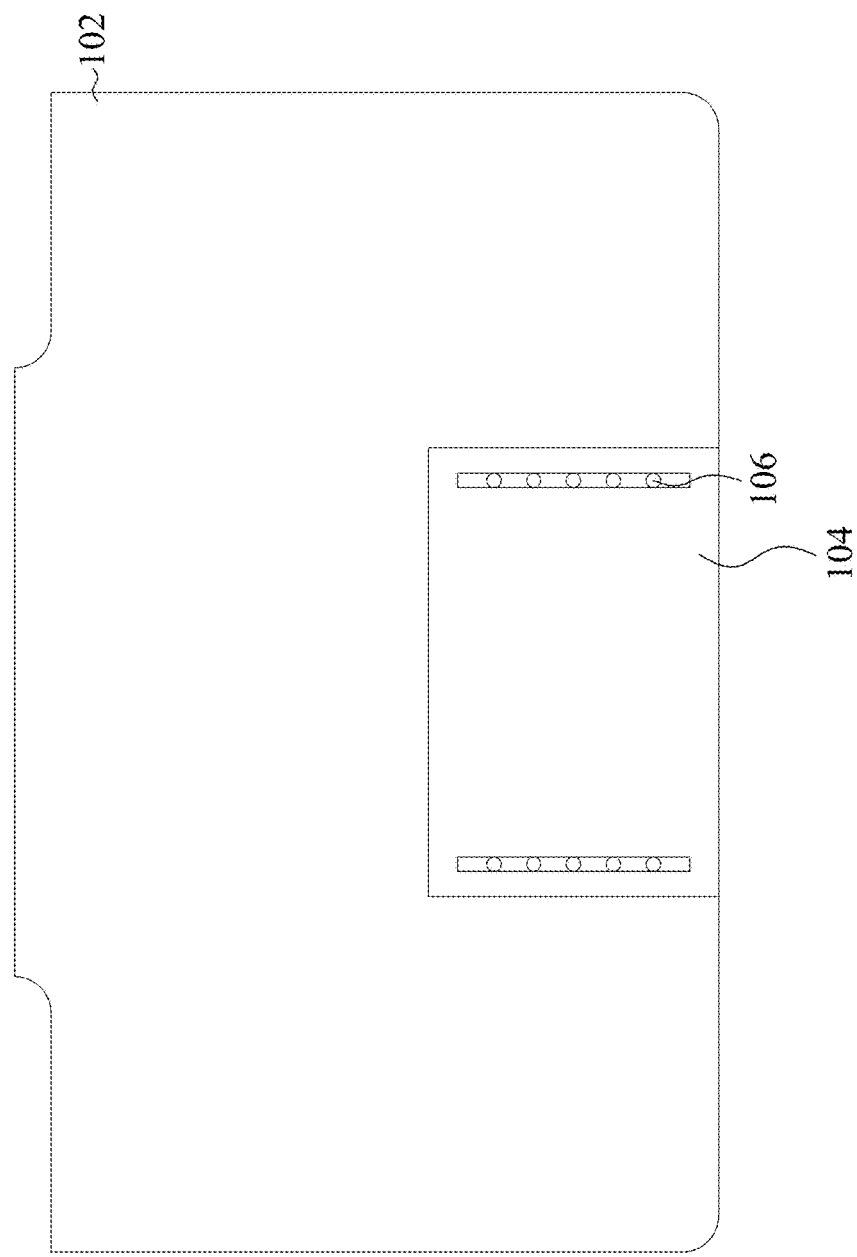

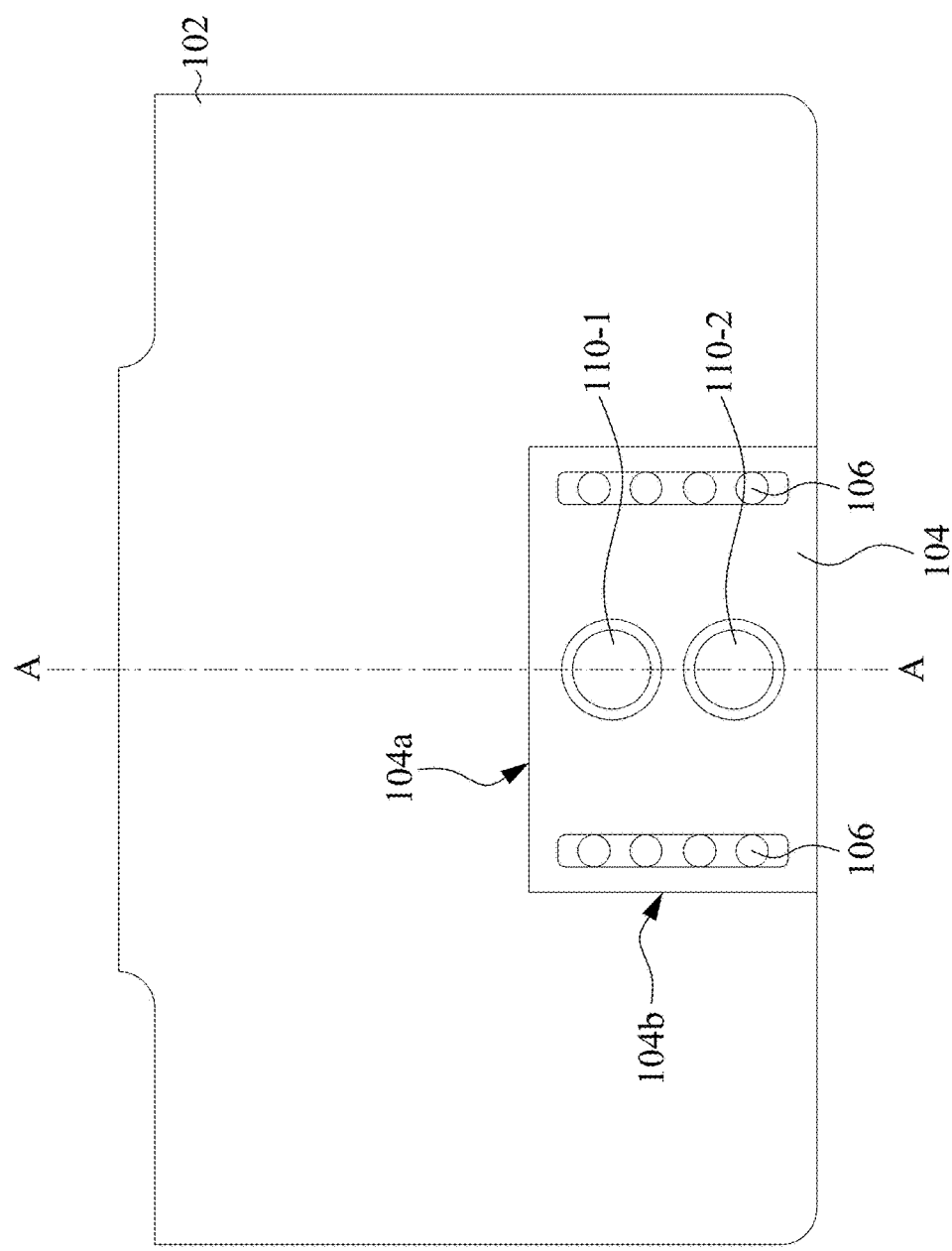

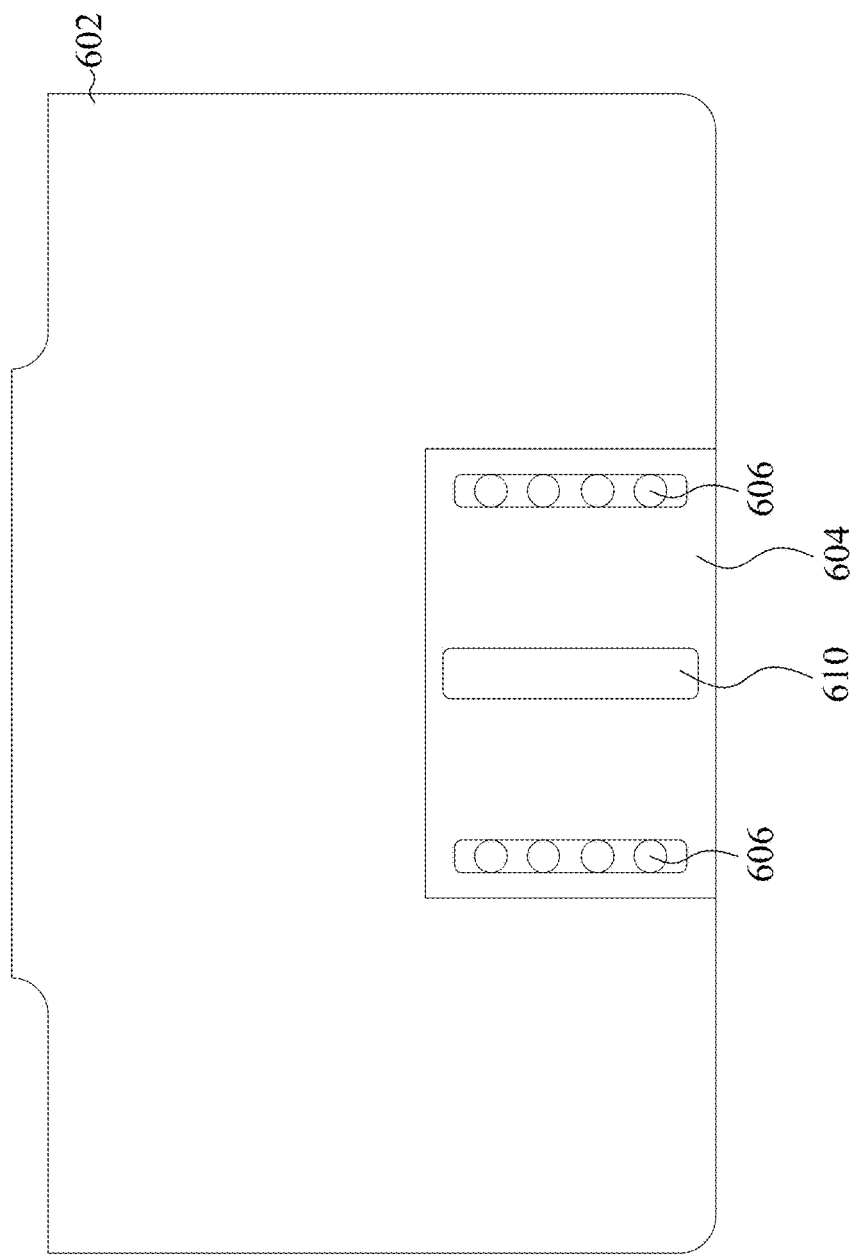

BONDING TOOL AND BONDING METHOD THEREOF

PRIORITY CLAIM AND CROSS-REFERENCE

This application is a continuation of U.S. patent application Ser. No. 17/672,285, filed Feb. 15, 2022, and claims the benefit of U.S. Provisional Application No. 63/227,805 filed on Jul. 30, 2021, entitled "BONDING SYSTEM AND METHOD," which is hereby incorporated by reference in its entirety.

BACKGROUND

Electronic equipment involving semiconductor devices is essential for many modern applications. Technological advances in materials and design have produced generations of semiconductor devices where each generation has smaller and more complex circuits than the previous generation. As semiconductor technologies further advance, stacked semiconductor devices, e.g., 3D integrated circuits (3DIC), have emerged as an effective alternative to further reduce the physical size of a semiconductor device. However, there are challenges in stacking semiconductor devices and reducing manufacturing costs.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

FIGS. 1A to 1D are schematic views of a bonding tool according to aspects of one or more embodiments of the present disclosure.

FIGS. 5A to 5B are schematic views of a bonding tool according to aspects of one or more embodiments of the present disclosure.

FIGS. 6A to 6C are schematic views of a bonding tool according to aspects of one or more embodiments of the present disclosure.

DETAILED DESCRIPTION

Figure 1C:
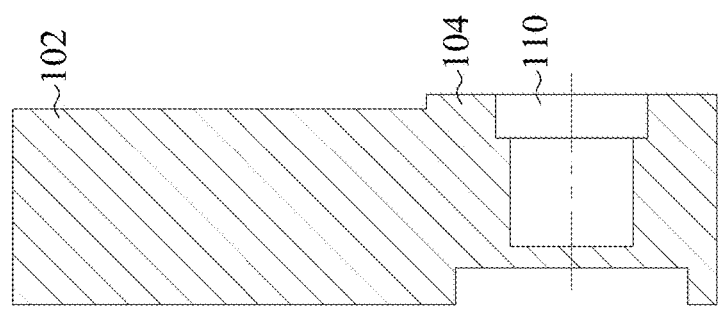

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Semiconductor devices have incorporated greater and greater functionality along with continuing reductions in size. In order to manufacture semiconductor devices with efficiency and low cost, discrete device chips, dies or wafers are bonded and electrically interconnected. A device package may be formed accordingly. Among the various semiconductor bonding technologies, die-to-wafer bonding involves attachment and electrical interconnection between a die and a wafer. Die-to-wafer bonding technologies require precise alignment between the dies and the wafer. Moreover, caution should be exercised in order not to leave undesired gaps or voids at the interface between the bonded die and wafer. If an undesired void or misalignment is found in the bonded die and wafer, a bonding failure may occur.

Some embodiments of the present disclosure provide a bonding tool and a bonding method thereof. The proposed method for bonding a semiconductor die and a semiconductor wafer provides advantages. By deflecting, deforming or bending a semiconductor die with a bending member, an initial contact between a center area of the semiconductor die and the semiconductor wafer may be achieved. Hence, voids and/or gas pockets may be avoided at the interface between the bonding surfaces of the semiconductor die and the semiconductor wafer, and the performance of the bonding may be elevated.

Figure 1D:
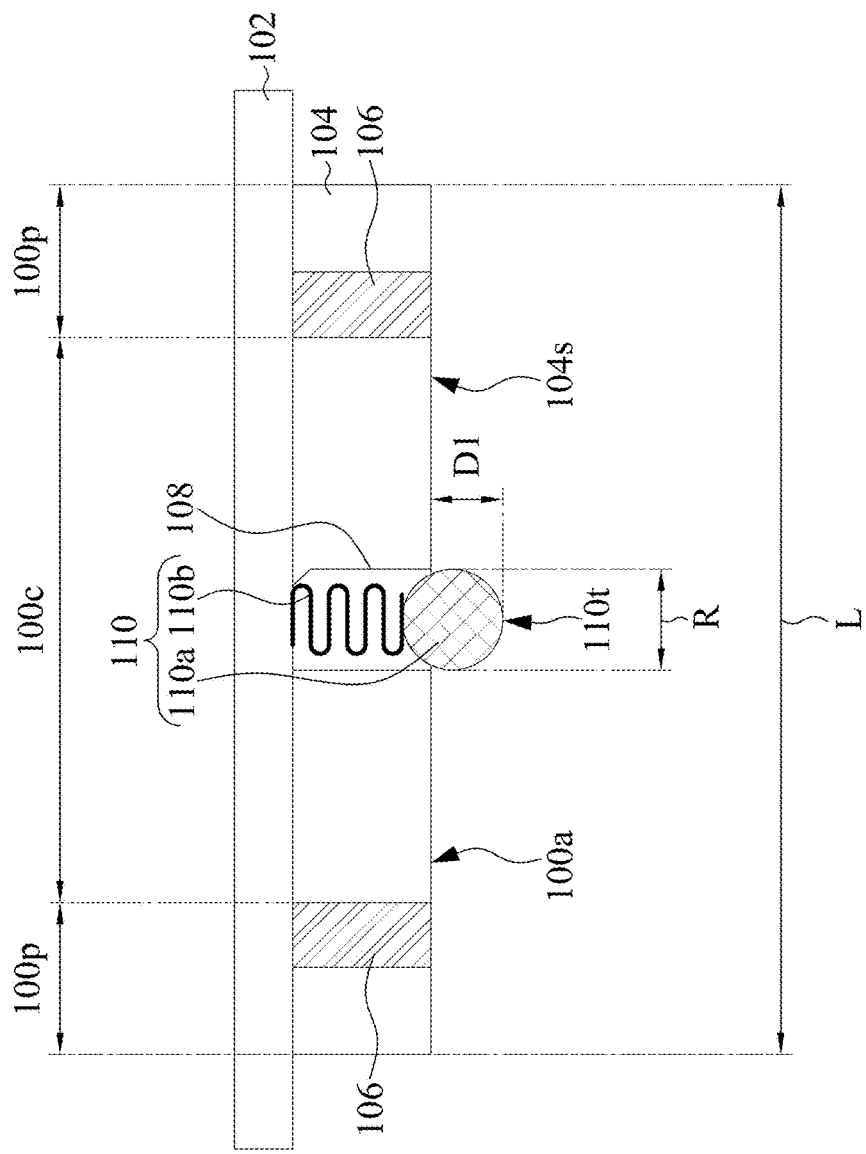

FIGS. 1A to 1D are schematic views of a bonding tool 100 according to aspects of one or more embodiments of the present disclosure. FIG. 1A is a top view of the bonding tool 100, FIG. 1B is a bottom view of the bonding tool 100, FIG. 1C is a cross-sectional view of the bonding tool 100 taken along line A-A, and FIG. 1D is an enlarged cross-sectional view of the bonding tool 100 taken along line B-B. Some of these features illustrated in FIGS. 1A through 1D may be exaggerated and/or not proportional in FIGS. 1A to 1D and subsequent figures, in order to clearly convey aspects of the illustrated embodiments.

Referring to FIGS. 1A and 1B, the bonding tool 100 includes a stage 102 and a wafer chuck 104. In some embodiments, the stage 102 is configured to support and hold the wafer chuck 104. The stage 102 may be configured to move the wafer chuck 104 to predetermined positions for facilitating die-to-wafer bonding operations. In some embodiments, the wafer chuck 104 is held by or mounted on the stage 102. The wafer chuck 104 may be configured to engage, hold or clamp a workpiece, such as a semiconductor die (not shown), so as to keep the workpiece in place during processes of die-to-wafer alignment and bonding. In some embodiments, the wafer chuck 104 is configured to apply a sucking force to the workpiece. In some embodiments, the wafer chuck 104 is a vacuum chuck providing a vacuum force to hold the workpiece. The wafer chuck 104 may include vacuum holes 106 on its surface. In addition, a pump may be used to suck the workpiece by exerting vacuum force through the vacuum holes 106.

Referring to FIGS. 1A, 1C and 1D, the bonding tool 100 further includes a trench 108 and a bending member 110. In some embodiments, the bending member 110 is partially disposed in the trench 108. The bending member 110 may be movably arranged in the trench 108. In some embodiments, the bending member 110 is configured to exert a bending force upon the workpiece. The bonding tool 100 includes a first surface 100a. In some embodiments, a surface 104s of the wafer chuck 104 is referred to as the first surface 100a of the bonding tool 100. In some embodiments, the bending member 110 protrudes from the first surface 100a. The first surface 100a may have a central region 100c and a peripheral region 100p laterally surrounding the central region 100c. In some embodiments, the trench 108 is located at the central region 100c of the first surface 100a. In other words, the bending member 110 is disposed in the central region 100c of the first surface 100a. In some embodiments, the vacuum holes 106 are disposed in the peripheral region 100p of the first surface 100a. In some alternative embodiments, the vacuum holes 106 laterally surround the bending member 110.

Still referring to FIG. 1D, the bending member 110, which may also be referred to as a bend-inducing member, is configured to bend an object. The bending member 110 includes a plunger device. In some embodiments, the bending member 110 is an elastic plunger device. The bending member 110 may include a body 110a and a spring 110b connected to the body 110a. In some embodiments, the body 110a is in a shape of sphere, semi-sphere, cylinder, prism, or the like. The spring 110b may be designed for contraction, compression and/or tension of the bending member 110. In some embodiments, the spring 110b is a coil spring. In alternative embodiments, the spring 110b may include spring steel, sponge, cushion, or the like. In some embodiments, the body 110a is movably arranged in the trench 108. For example, when the bending member 110 is in its normal position (unstrained position), the body 110a protrudes from the first surface 100a. When the bending member 110 is in its retracted position, a top surface 110t of the body 110a is substantially level with or lower than the first surface 100a. The body 110a may have a radius R. In some embodiments, the radius R of the body 110a is substantially greater than 1 millimeter (mm). In some embodiments, the radius R of the body 110a is substantially greater than 1.5 mm. In some embodiments, the radius R of the body 110a is in a range from about 1 mm to about 8 mm. The wafer chuck 104 may have a length L. In some embodiments, the length L of the wafer chuck 104 is greater than the radius R of the body 110a. In some embodiments, the radius R of the body 110a is substantially less than half of the length L of the wafer chuck 104.

Figure 1E:
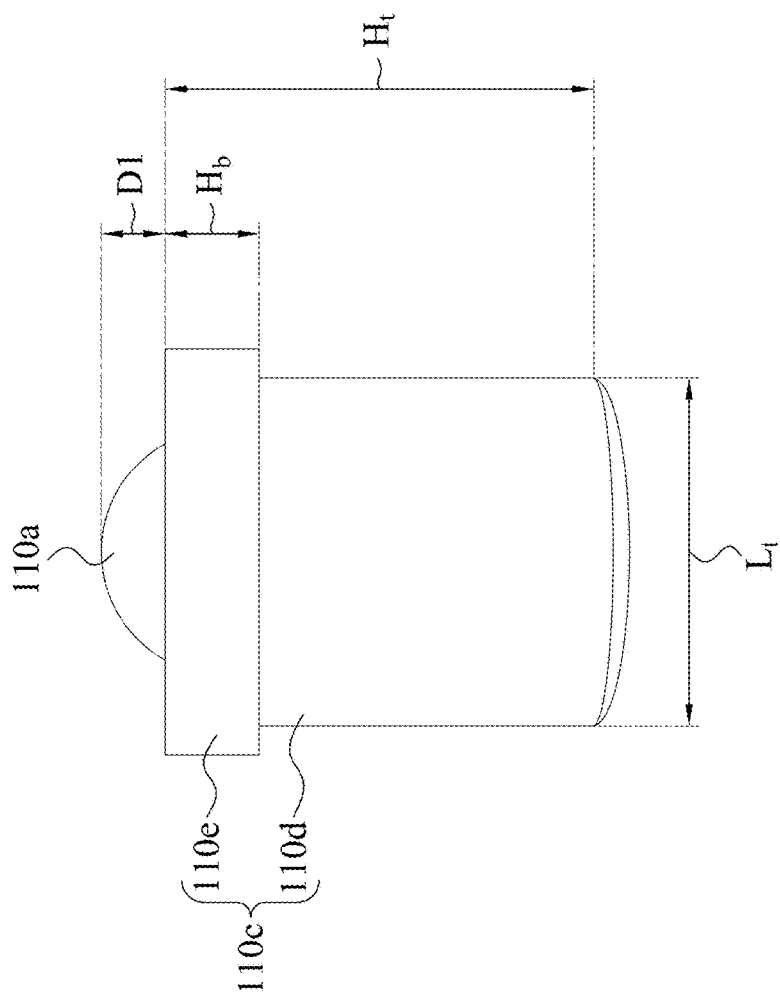
FIGS. 1E to 1F are schematic views of a bending member according to aspects of one or more embodiments of the present disclosure.
Figure 1F:
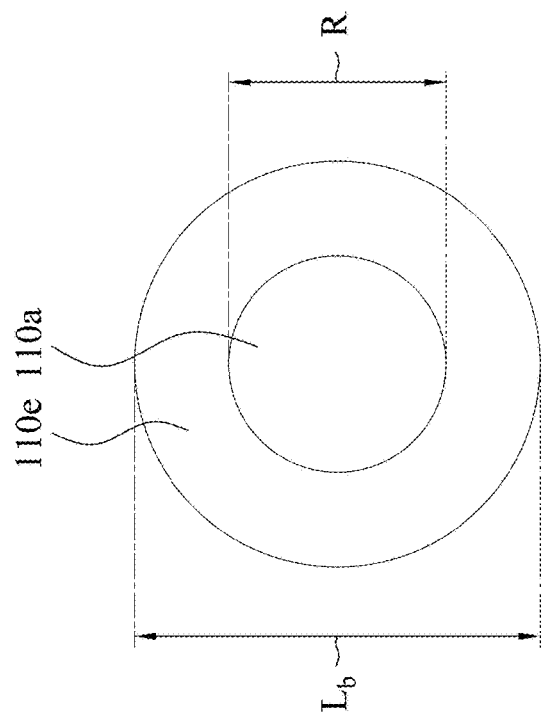

FIGS. 1E to 1F are schematic views of the bending member 110 according to aspects of one or more embodiments of the present disclosure. FIG. 1E is a side view of the bending member 110, and FIG. 1F is a top view of the bending member 110. As illustrated in FIGS. 1E and 1F, the bending member 110 may further include a vessel 110c for accommodating the body 110a and the spring 110b. In some embodiments, the body 110a protrudes from the first surface 100a by a distance D1. Furthermore, the body 110a retracts to the retracted position during the process of die-to-wafer bonding, and the distance D1 may be less than or substantially equal to 0, which means the top of the body 110a is lower than the first surface 100a. In some embodiments, during an idle stage without retraction, the distance D1 is in a range from about 0.3 mm to about 2.4 mm. In some embodiments, when the body 110a retracts to the retracted position by the bonding pressure, the spring 110b contracts accordingly.

Still referring to FIGS. 1E to 1F, the vessel 110c may further include a tube 110d and a belt 110e laterally surrounding the tube 110d. The tube 110d is configured to accommodate the body 110a and the spring 110b. The tube 110d may include a height $H_t$ and a length $L_t$. In some embodiments, the height $H_t$ is in a range from about 3 mm to about 11.5 mm. In some embodiments, the length $L_t$ is in a range from about 2 mm to about 10 mm. The belt 110e may include a height $H_b$ and a length $L_b$. In some embodiments, the height $H_b$ is in a range from about 0.5 mm to about 1.5 mm. In some embodiments, the length $L_b$ is in a range from about 2.5 mm to about 10.6 mm.

Figure 2:
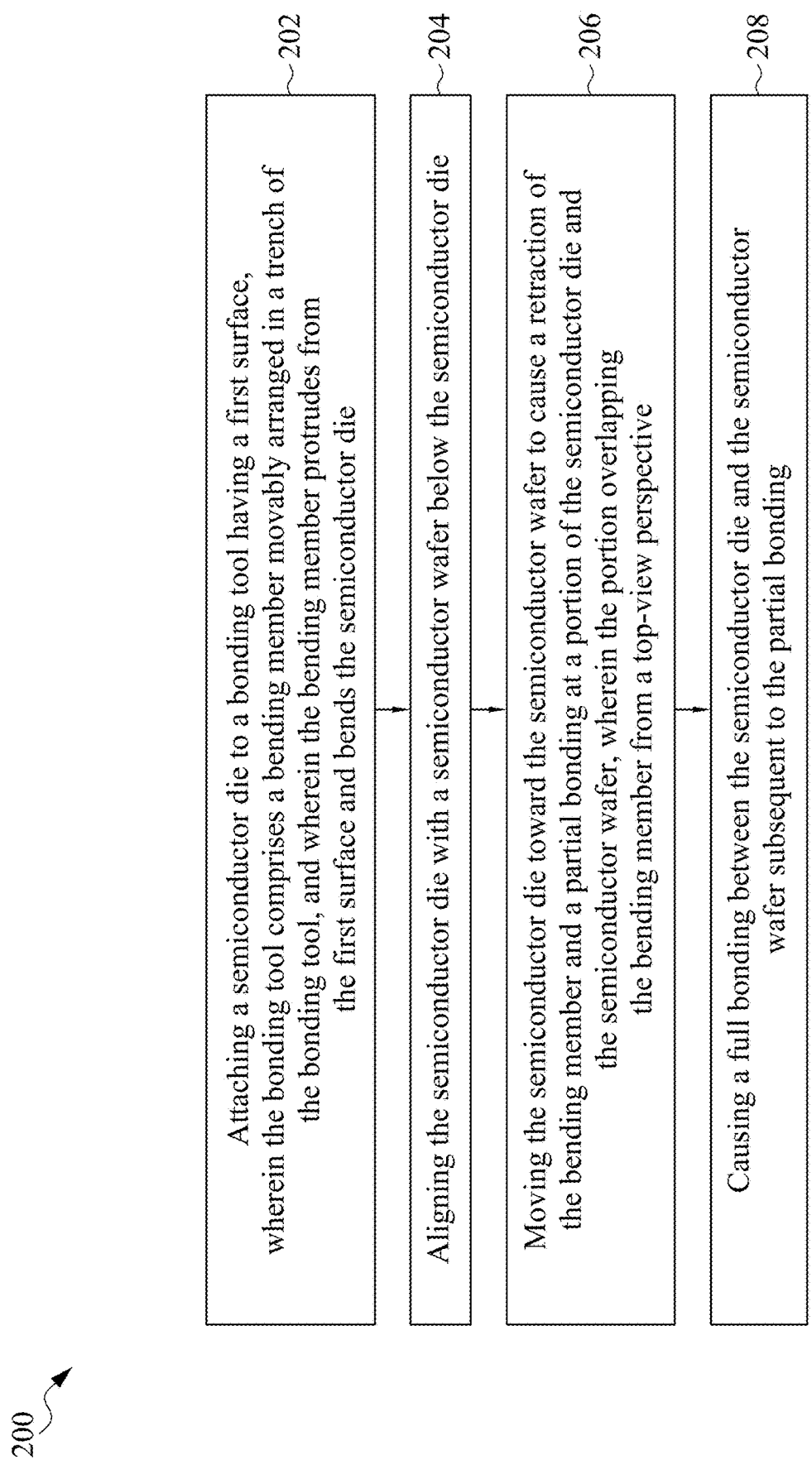
FIG. 2 is a flowchart representing a method according to aspects of one or more embodiments of the present disclosure.

FIG. 2 is a flowchart representing a method 200 according to aspects of one or more embodiments of the present disclosure. The method 200 includes an operation 202, in which a semiconductor die is attached to a bonding tool. In some embodiments, the bonding tool includes a bending member movably arranged in a trench of the bonding tool. The bonding tool may have a first surface. In some embodiments, the bending member protrudes from the first surface and bends the semiconductor die. The method 200 further includes an operation 204, in which the semiconductor die is aligned with a semiconductor wafer below the semiconductor die. The method 200 further includes an operation 206, in which the semiconductor die is moved toward the semiconductor wafer to cause a retraction of the bending member and a partial bonding at a portion of the semiconductor die and the semiconductor wafer. In some embodiments, the portion of the semiconductor die overlaps the bending member from a top-view perspective. The method 200 further includes an operation 208, in which a full bonding is caused between the semiconductor die and the semiconductor wafer subsequent to the partial bonding.

The method 200 is described for a purpose of illustrating concepts of the present disclosure and the description is not intended to limit the present disclosure beyond what is explicitly recited in the claims. Additional operations can be provided before, during, and after the method illustrated above and in FIG. 2, and some operations described can be replaced, eliminated, or moved around for additional embodiments of the method.

FIGS. 3A to 3F are cross-sectional views illustrating a process of die-to-wafer alignment and bonding at different stages according to aspects of one or more embodiments of the present disclosure.

Figure 3A:
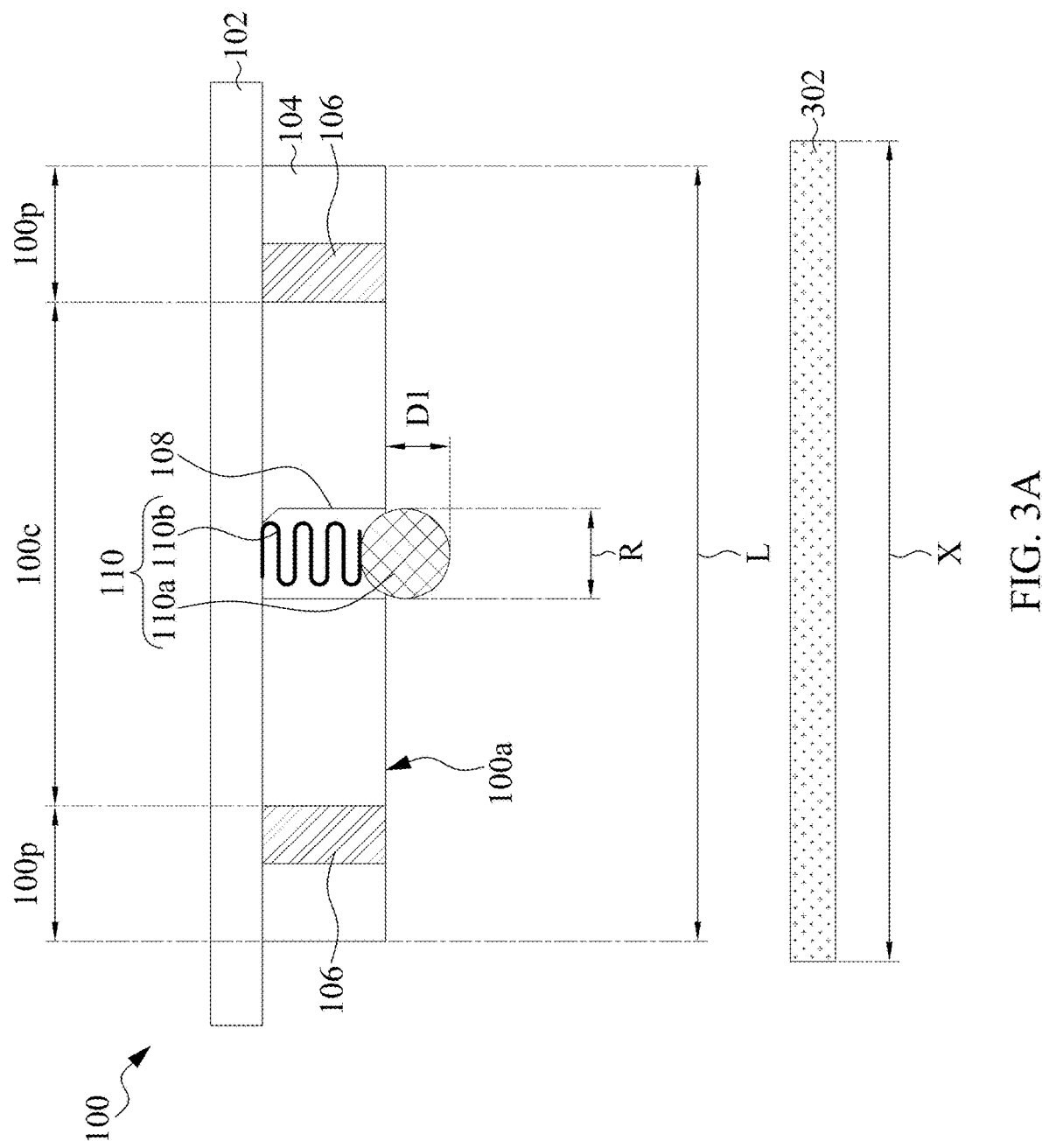
FIGS. 3A to 3F are cross-sectional views illustrating a process of die-to-wafer alignment and bonding at different stages according to aspects of one or more embodiments of the present disclosure.

Referring to FIG. 3A, a bonding tool 100 and a semiconductor die 302 are received. The bonding tool 100 may be the bonding tool 100 discussed with respect to FIG. 1. The semiconductor die 302 may be any type of die. For example, the semiconductor die 302 may be a logic die, a system-on-chip (SOC) die, an application specific integrated circuit (ASIC) die, a sensor die, a memory die, or the like. The semiconductor die 302 may be formed using any acceptable process.

Still referring to FIG. 3A, the bonding tool 100 is placed on and aligned with the semiconductor die 302. The semiconductor die 302 may have a length (or a radius) X. In some embodiments, the length X of the semiconductor die 302 is less than or substantially equal to the length L of the wafer chuck 104. In some embodiments, the length X of the semiconductor die 302 is greater than about 1.5 mm. The bonding tool 100 may be placed on and aligned with the semiconductor die 302 by aligning the center of the bonding tool 100 with the center of the semiconductor die 302. For example, the bonding tool 100 may be placed on and aligned with the semiconductor die 302 by aligning the position of the body 110a with the center of the semiconductor die 302. In some embodiments where the length X of the semiconductor die 302 is substantially equal to the length L of the wafer chuck 104, the bonding tool 100 may be placed on and aligned with the semiconductor die 302 by aligning an edge of the wafer chuck 104 with an edge of the semiconductor die 302.

Figure 3B:
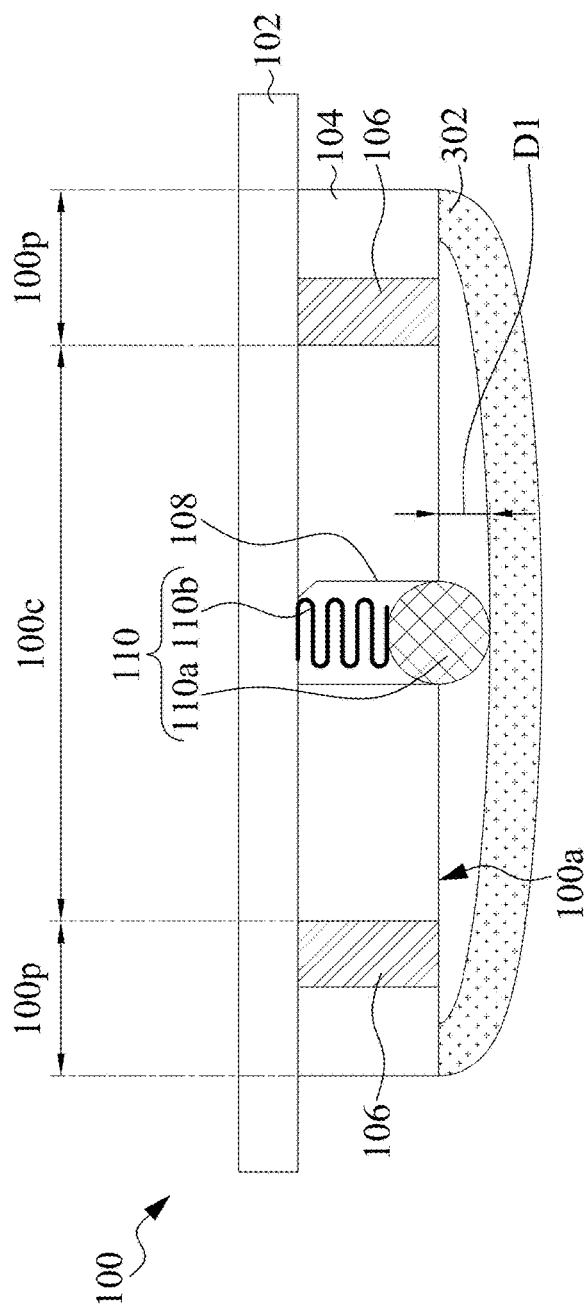

Referring to FIG. 3B, the semiconductor die 302 is attached to the bonding tool 100. The respective step is described as operation 202 of the method 200 in FIG. 2. The semiconductor die 302 is placed and secured on bonding tool 100 from the first surface (or bonding surface) 100a. A vacuum system may be coupled to the bonding tool 100 and may be used to secure the semiconductor die 302. In some embodiments, the attachment of the semiconductor die 302 includes holding a peripheral region of the semiconductor die 302 by the vacuum holes 106 of the bonding tool 100. For example, the vacuum holes 106 are located on the first surface 100a such that a pressure differential may be applied to a back (e.g., non-bonding) surface of the semiconductor die 302. The semiconductor die 302 may be secured to the bonding tool 100 such that the semiconductor die 302 conforms to the first surface 100a and the bending member 110 through an elastic deformation or deflection. For example, when a vacuum system is used, a suction or a pressure differential applied to the back (e.g., non-bonding) surface of the semiconductor die 302 may cause the semiconductor die 302 to conform to the first surface 100a and the bending member 110. In some embodiments, the vacuum system is turned on, and subsequently the bonding tool 100 is placed on the semiconductor die 302. The bonding tool 100 can be positioned above the semiconductor die 302 with the first surface 100a facing the semiconductor die 302.

Still referring to FIG. 3B, the bending member 110 protrudes from the first surface 100a and causes the semiconductor die 302 to deflect or deform. In some embodiments, the semiconductor die 302 is secured to the bonding tool 100 and deformed by the protrusion of and force from the bending member 110. The semiconductor die 302 is deformed or deflected, such as by an elastic deformation or deflection. In some embodiments, the bending member 110 is maintained in its unstrained position (i.e., protruding from the first surface 100a) during the attachment of the semiconductor die 302 to the bonding tool 100. In some embodiments, the bending member 110 is maintained and protrudes from the first surface 100a by the distance D1 at this stage. In alternative embodiments, the bending member 110 is retracted and protrudes from the first surface 100a by a distance Dx (not shown) less than the distance D1. In some embodiments, the bending member 110 is retracted by the contraction of the spring 110b and the retraction of the body 110a.

Figure 3C:
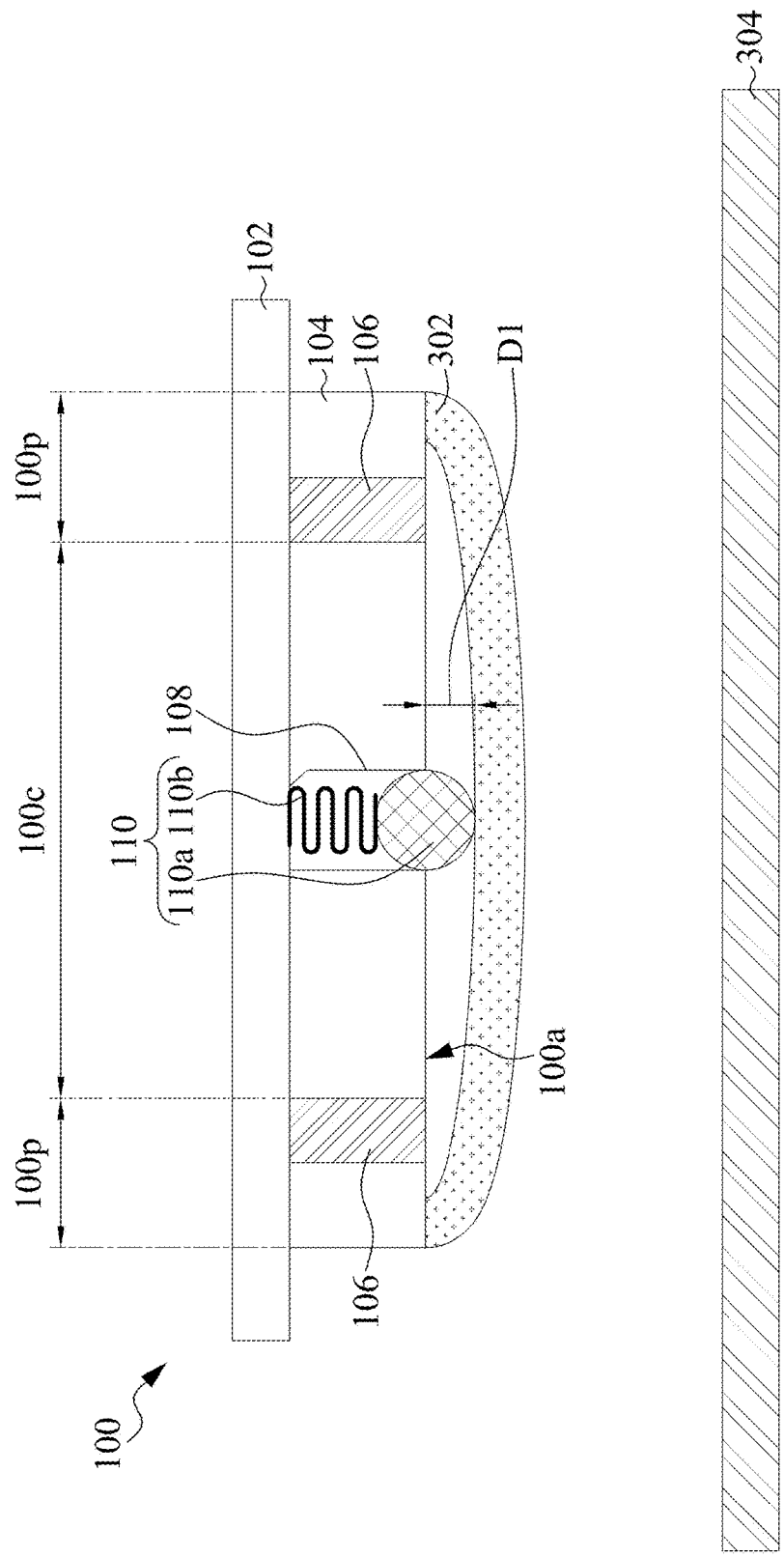

Referring to FIG. 3C, the semiconductor die 302 is aligned with a semiconductor wafer 304 below the semiconductor die 302. The respective step is described as operation 204 of the method 200 in FIG. 2. FIG. 3C illustrates an enlarged view of the semiconductor die 302 and the semiconductor wafer 304. In some embodiments, the semiconductor die 302 is aligned with the semiconductor wafer 304 through an optical alignment operation, which will be discussed in greater detail with respect to FIGS. 4A and 4B. In some embodiments, the bending member 110 is maintained and protrudes from the first surface 100a by the distance D1 at this stage. In other words, the bending member 110 is maintained in its unstrained position at this stage. In alternative embodiments, the bending member 110 is retracted and protrudes from the first surface 100a by a distance Dy (not shown) less than the distance D1 or less than the distance Dx in the previous stage.

The semiconductor wafer 304 may be any type of wafer. For example, the semiconductor wafer 304 can be a wafer comprising logic dies, system-on-chip (SOC) dies, application specific integrated circuit (ASIC) dies, sensor dies, memory dies, or the like. In an example, the semiconductor wafer 304 is a wafer comprising SOC dies, and the semiconductor die 302 is an ASIC die. In another example, the semiconductor wafer 304 is a wafer comprising logic dies, and the semiconductor die 302 is a sensor die, e.g., an image sensor die.

The semiconductor wafer 304 may be formed before bonding using any acceptable process. Then, the semiconductor wafer 304 is placed and secured on a bonding stage 410 (see FIG. 4B). A vacuum system may be coupled to the bonding stage 410 and may be used to secure the semiconductor wafer 304. For example, many small holes or perforations may be arranged in the bonding stage 410 such that a pressure differential may be applied to a back (e.g., non-bonding) surface of the semiconductor wafer 304. The semiconductor wafer 304 may be secured to the bonding stage 410 such that the semiconductor wafer 304 conforms to the surface of the bonding stage 410. In some embodiments, the surface of the bonding stage 410 is substantially flat. Additionally, the semiconductor wafer 304 is substantially flat at this stage. In some embodiments, the bonding tool 100 may be positioned above the bonding stage 410 with the bonding surfaces of the semiconductor die 302 and the semiconductor wafer 304 facing each other.

Figure 3D:
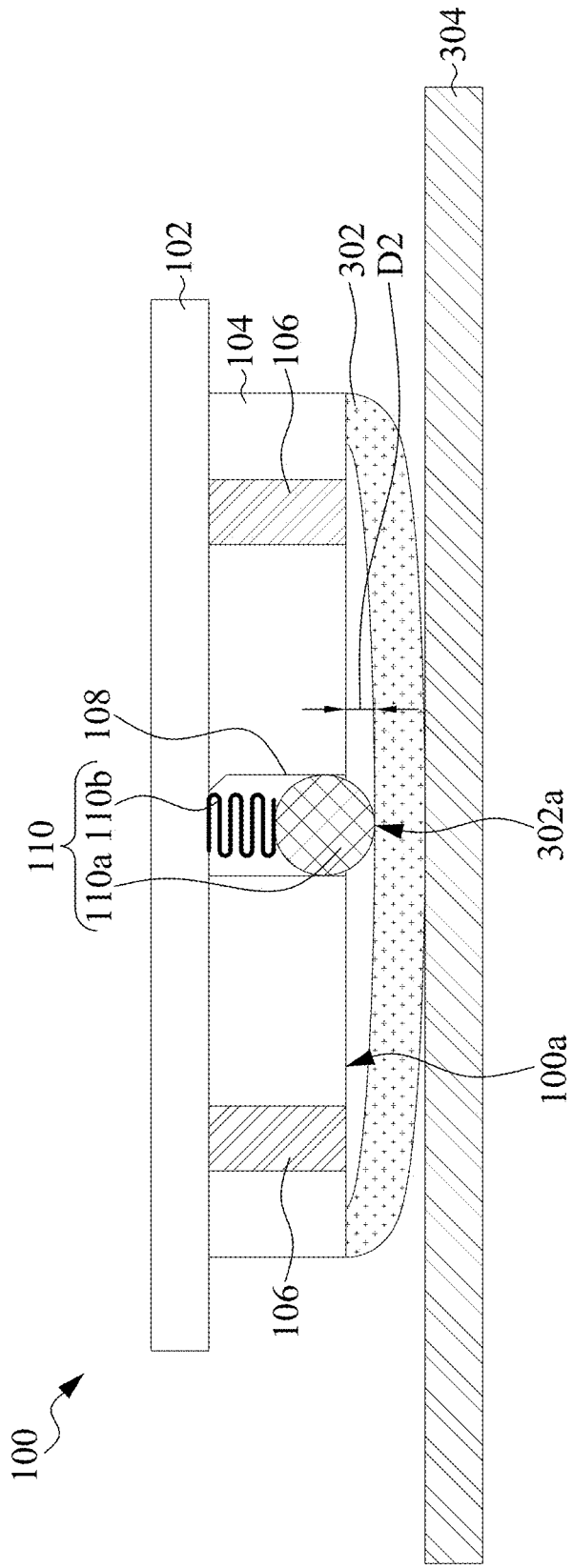

Referring to FIG. 3D, the semiconductor die 302 is moved toward the semiconductor wafer 304 and contacts the semiconductor wafer 304 to cause a retraction of the bending member 110 and a partial bonding at a portion 302a (may also be referred to as a central portion) of the semiconductor die 302 and the semiconductor wafer 304. The respective step is described as operation 206 of the method 200 in FIG. 2. In some embodiments, the bending member 110 protrudes or extends from the first surface 100a, causing the semiconductor die 302 to deflect and causing the bonding surfaces of the semiconductor die 302 to contact the semiconductor wafer 304.

The semiconductor die 302 contacts the semiconductor wafer 304 while the semiconductor wafer 304 is secured to and conforming to the bonding stage 410 (see FIG. 4B), i.e., while the semiconductor wafer 304 is substantially flat. Furthermore, the semiconductor die 302 contacts the semiconductor wafer 304 while the semiconductor die 302 is secured to the bonding tool 100 and is deflected by the bending member 110. Accordingly, the semiconductor die 302 and the semiconductor wafer 304 are initially brought into contact while the semiconductor die 302 is deflected and the semiconductor wafer 304 is substantially flat.

The semiconductor die 302 and the semiconductor wafer 304 may be held in contact in the above-described position for a period of time, such as between about 0 seconds and about 5 seconds, between about 5 seconds and about 10 seconds, or another suitable period of time. In this manner, the contacting portions of the semiconductor die 302 and the semiconductor wafer 304 (e.g., a center of the bonding surface of the semiconductor die 302 and a designated area of the bonding surface of the semiconductor wafer 304) may initiate bonding, such as through chemical reactions (e.g., to form covalent and/or ionic bonds) and/or atomic attractive forces (e.g., such as polar forces and/or hydrogen bonding). In some embodiments, a partial bonding is caused or formed between the portion 302a of the semiconductor die 302 and the semiconductor wafer 304. The portion 302a may overlap the bending member 110 from a top-view perspective. Once bonding is initiated, a progressive attachment, which may also be referred to as a progressive bonding or a bond wave, at the bonding surface occurs. The progressive attachment may propagate outwardly from the center of the semiconductor die 302 to the edges of the semiconductor die 302. In some embodiments, the bending member 110 is retracted from the first surface 100a during the operation. The retraction of the bending member 110 is thus caused by the retraction of the body 110a and the contraction of the spring 110b. In some embodiments, the bending member 110 protrudes from the first surface 100a by a distance D2 at this stage. The distance D2 is less than the distance D1 in the previous stage.

In some embodiments, a bonding profile of the semiconductor die 302 and the semiconductor wafer 304 is monitored in situ. For example, during the partial bonding of the semiconductor die 302 and the semiconductor wafer 304, several factors, such as a sensing current, position speed, pressure and/or force, may be monitored in situ. In some embodiments, a pressure between the semiconductor die 302 and the semiconductor wafer 304 is monitored during the partial bonding. In some embodiments, the operation of the partial bonding stops if (in response to) the pressure exceeds a predetermined range. In some embodiments, the sensing current associated with a bonding pressure between the semiconductor die 302 and the semiconductor wafer 304 is monitored during the partial bonding. The sensing current may also provide an indicator as to whether the bonding pressure is uniform across different orientations of the contact area. A greater disparity of bonding pressure values in different orientations of the contact area, which may be a source of a bonding failure, leads to a higher level of the sensing current. In some embodiments, the operation of the partial bonding stops if a variation of the sensing current exceeds a predetermined range. In some embodiments, the bonding profile is monitored to detect whether a bonding failure occurs.

Figure 3E:
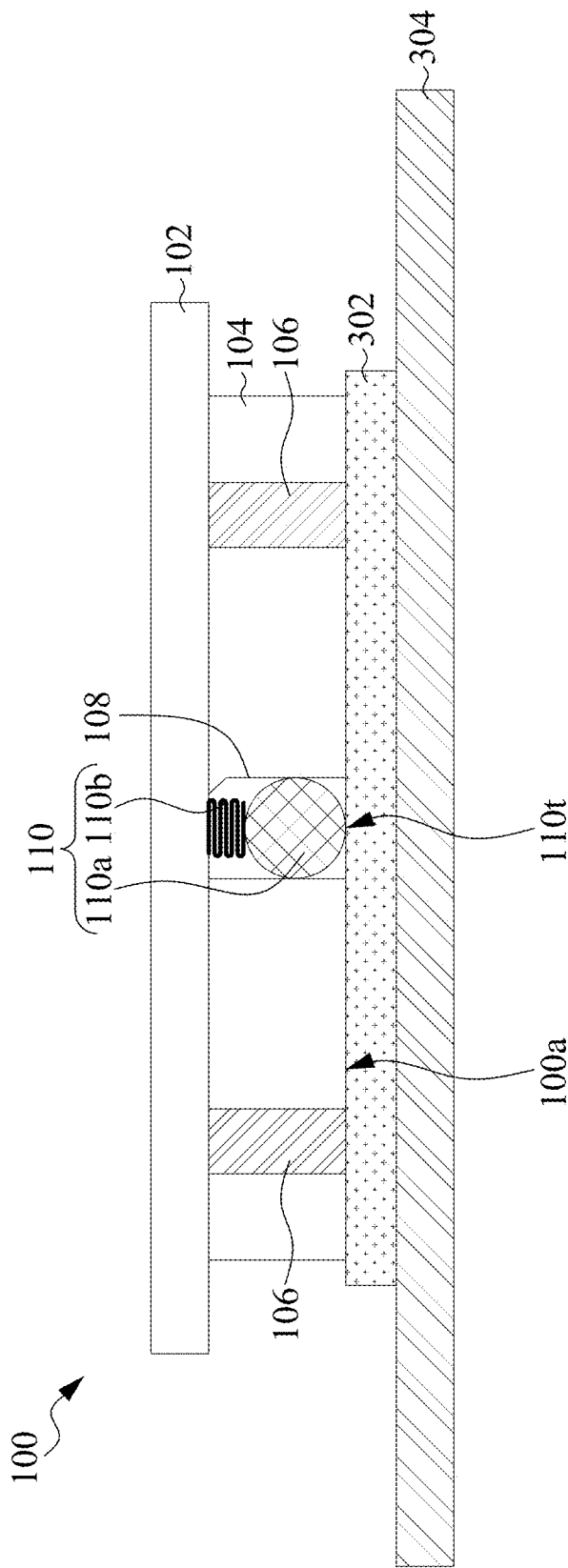

Referring to FIG. 3E, a full bonding is caused between the semiconductor die 302 and the semiconductor wafer 304 subsequent to the partial bonding. The respective step is described as operation 208 of the method 200 in FIG. 2. Once the semiconductor die 302 and the semiconductor wafer 304 are in full contact, the bonding tool 100 is used to apply a bonding pressure between the semiconductor die 302 and the semiconductor wafer 304 to reinforce the bonding performance. In some embodiments, the pressure is between about 50 mN and about 1,000 mN, although any suitable pressure that can be used to aid in the bonding process may alternatively be used. Additionally, if desired, heat may be added using a thermal operation. In some embodiments, the temperature may be controlled between about 20° C. and about 25° C., although any suitable temperature that can be used to aid in the bonding process may alternatively be used.

As the pressure is applied to the semiconductor die 302 and the semiconductor wafer 304, the semiconductor die 302 and the semiconductor wafer 304 will be bonded together at each point where the semiconductor die 302 comes into contact with the semiconductor wafer 304. Because the semiconductor die 302 is deflected or deformed during the previous stage, the pressure causes the bonding to proceed progressively from the portion 302a towards the edges of the semiconductor die 302. The semiconductor die 302 may return to its natural form, such as a planar die, during the full bonding. Additionally, after the bond wave (i.e., progressive attachment, progressive bonding) is initiated, as discussed with respect to FIG. 3D, the bond wave may continue to propagate outwardly, causing reactions and/or atomic attractive forces to occur between remaining portions of the bonding surfaces of the semiconductor die 302 and the semiconductor wafer 304. Due to the contact between the bonding surfaces in center areas and permitting a bond wave to propagate outwardly, voids and/or gas pockets may be avoided at the bonding interface between the bonding surfaces of the semiconductor die 302 and the semiconductor wafer 304. In some embodiments, the bending member 110 continues to maintain retracted during the operation of the full bonding. In some embodiments, a top surface of the bending member 110, i.e, the top surface 110t of the body 110a is substantially level with the first surface 100a at this stage.

Figure 3F:
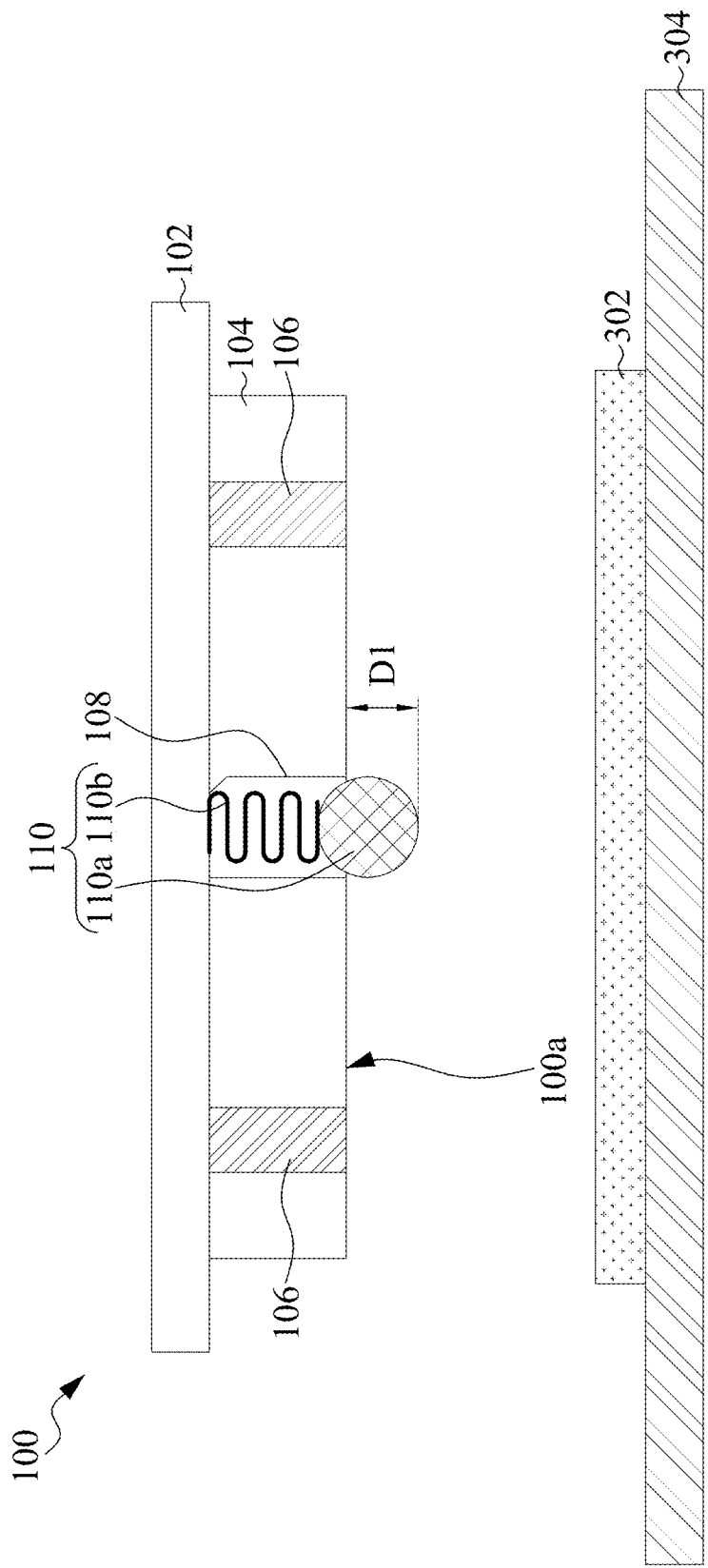

Referring to FIG. 3F, the semiconductor die 302 is released from the bonding tool 100. In some embodiments, the suction or pressure differential caused by the respective vacuum system may be removed. Once the semiconductor die 302 is released, the bending member 110 may be released back to its natural form, such as its unstrained position. In some embodiments, the bending member 110 may be released to protrude from the first surface 100a by the distance D1 at this stage. In other words, the bending member 110 is restored to an initial form after the releasing.

The proposed method for bonding the semiconductor die and the semiconductor wafer provides advantages. In some scenarios where the semiconductor die 302 is secured or held by a bonding tool without the bending member 110, a large variation of the sensing current is observed, indicating a non-uniform bonding pressure distribution on the semiconductor die 302. By bonding the semiconductor die 302 by help of the bending member 110, a smaller variation of the sensing current is observed. In other words, the deflection or deformation of the semiconductor die 302 allows an initial contact with a much less contact area between the center area of semiconductor die 302 and the semiconductor wafer 304, which can ensure a more uniform bonding pressure distribution on the semiconductor die 302. Hence, voids and/or gas pockets may be avoided at the interface between the bonding surfaces of the semiconductor die 302 and the semiconductor wafer 304.

Figure 4A:
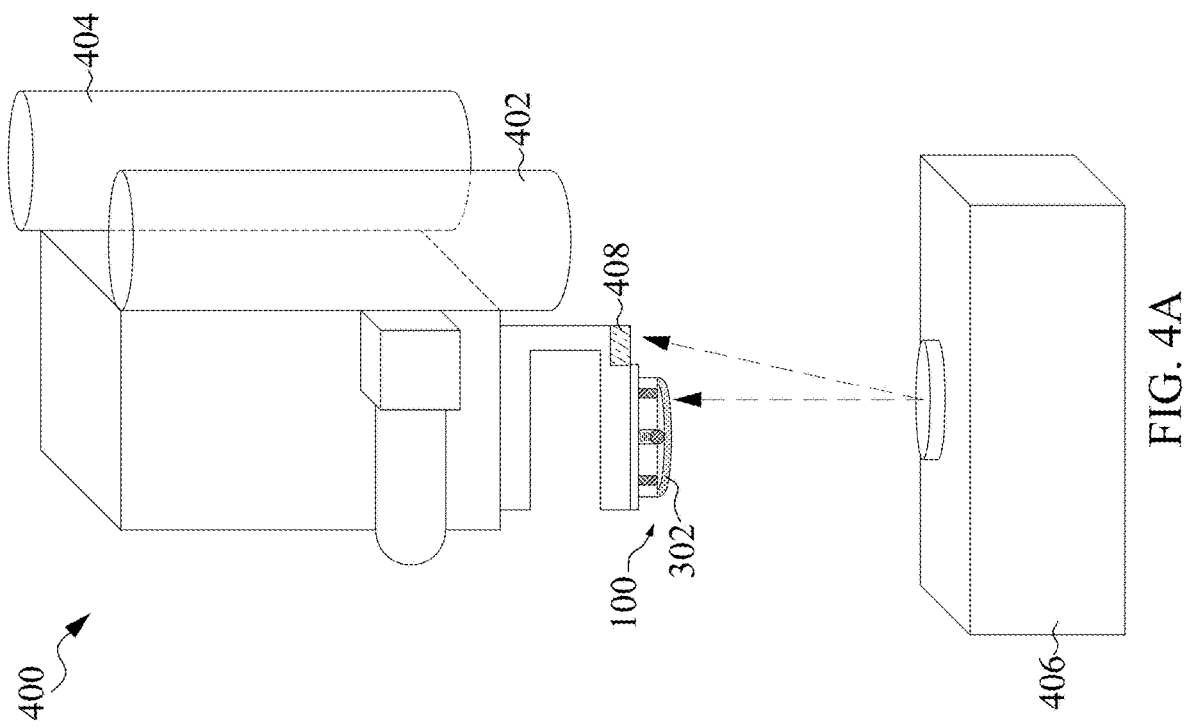
FIGS. 4A to 4B are schematic views illustrating a process of die-to-wafer alignment at different stages according to aspects of one or more embodiments of the present disclosure.
Figure 4B:
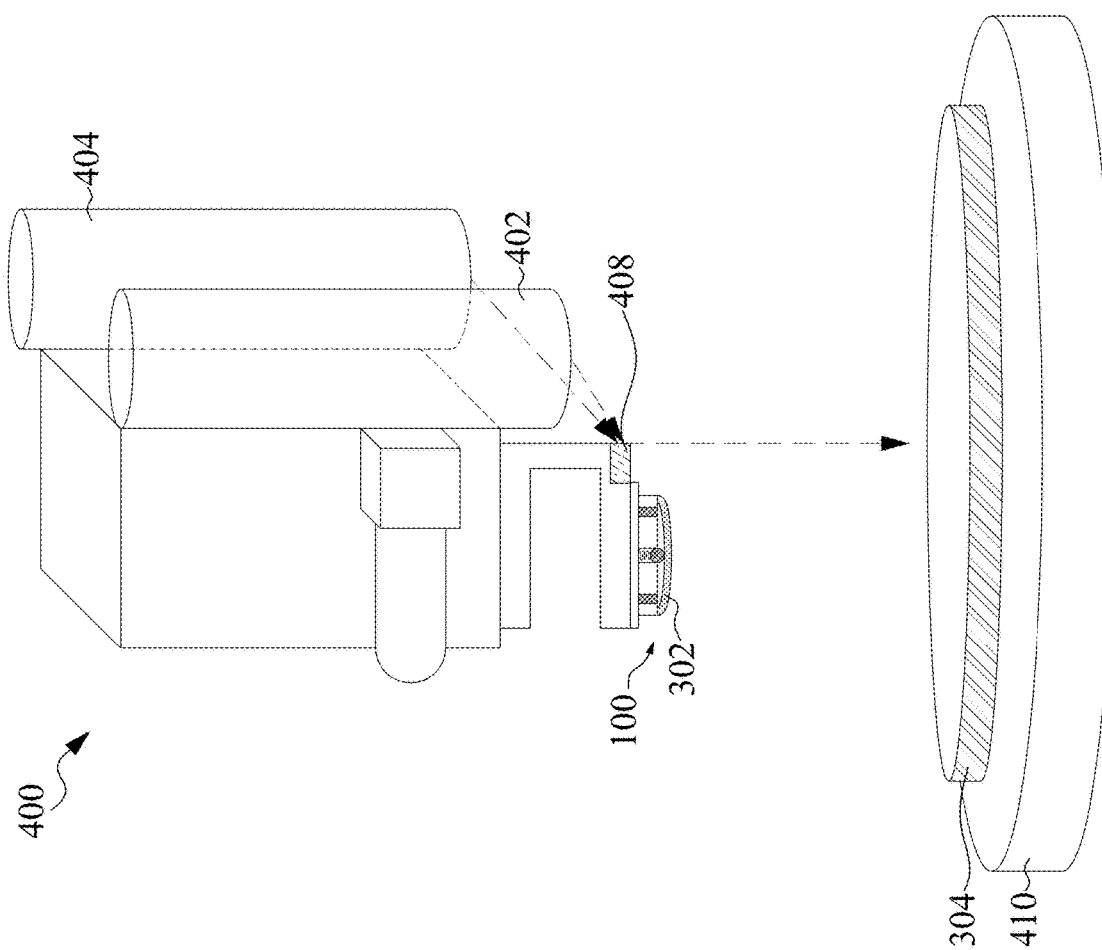

FIGS. 4A to 4B are schematic views illustrating a process of die-to-wafer alignment at different stages according to aspects of one or more embodiments of the present disclosure.

Referring to FIGS. 4A to 4B, an optical alignment measurement system 400 is disposed proximate to the bonding tool 100. In some embodiments, the optical alignment measurement system 400 is integrated into the bonding tool 100. In some embodiments, the optical alignment measurement system 400 includes a first image device 402, a second image device 404 and a third image device 406. In some embodiments, the optical alignment measurement system 400 further includes a fiducial mark 408 disposed proximate to the bonding tool 100. The first image device 402 and the second image device 404 may be configured to detect or recognize a location of the fiducial mark 408 and a location of the semiconductor wafer 304. The third image device 406 may be configured to detect or recognize a location of the fiducial mark 408 and a location of the semiconductor die 302.

The semiconductor wafer 304 is secured to and conforms to the bonding stage 410, while the semiconductor die 302 is secured to and conforms to the bonding tool 100. The optical alignment measurement system 400 may be used to align the semiconductor die 302 with the semiconductor wafer 304 for bonding. Various motors, such as stage motors, can drive each of the bonding tool 100 and the bonding stage 410 in an X-direction and a Y-direction for fine tuning of alignment of the semiconductor die 302 with the semiconductor wafer 304 for bonding. In some embodiments, other motors, such as software compensated spindle motors, can drive the bonding tool 100 around a Z-axis to rotate the semiconductor die 302 into alignment with the semiconductor wafer 304 for bonding.

The alignment process may be incorporated into the bonding process, e.g., the method 200, prior to bonding the semiconductor die 302 with the semiconductor wafer 304 and use the optical alignment measurement system 400 to align the semiconductor die 302 and the semiconductor wafer 304. Referring to FIG. 4A, the semiconductor die 302 on the bonding tool 100 is positioned to be inspected by the third image device 406. The location of the fiducial mark 408 adjacent to the semiconductor die 302 is also inspected by the third image device 406. The location of the fiducial mark 408 may represent the relative location of the semiconductor die 302. The image of the fiducial mark 408 may be digitized and is stored electronically for performing the alignment.

Referring to FIG. 4B, the bonding tool 100 is then moved, allowing the semiconductor die 302 to be brought to another location above the bonding stage 410. The semiconductor wafer 304 on the bonding stage 410 is inspected by the first image device 402 and the second image device 404. The location of the fiducial mark 408 adjacent to the semiconductor die 302 is also inspected by the first image device 402 and the second image device 404. The bonding tool 100 is then moved and is aligned with the existing digitized image of the fiducial mark 408 of the semiconductor die 302. The alignment may be performed by finely-tuned translation of the bonding tool 100 in an X-direction and/or a Y-direction, and/or by finely-tuned rotation of the bonding tool 100 about a Z-axis.

The structures and methods of the present disclosure are not limited to the above-mentioned embodiments and may have other different embodiments. To simplify the description and for convenience of comparison between each of the embodiments of the present disclosure, identical (or like) components in each of the following embodiments are marked with identical (or like) numerals. For making it easier to compare differences between the embodiments, the following description will detail dissimilarities among different embodiments, while identical features, values and definitions will not be repeated.

Figure 5B:
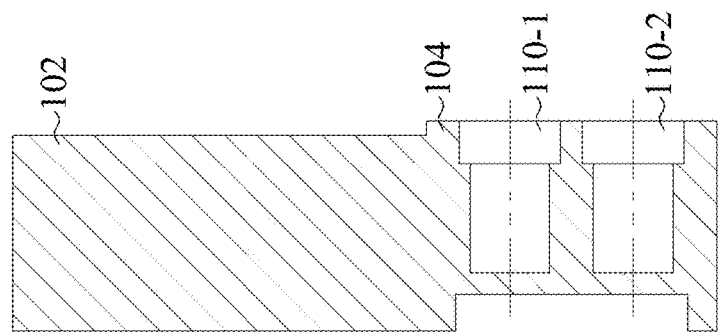

FIGS. 5A to 5B are schematic views of a bonding tool 500 according to aspects of one or more embodiments of the present disclosure. FIG. 5A is a top view of the bonding tool 500, and FIG. 5B is a cross-sectional view of the bonding tool 500 taken along line A-A.

Referring to FIGS. 5A to 5B, the bonding tool 500 may be similar to the bonding tool 100 in many aspects. The bonding tool 500 includes two bending members 110-1 and 110-2. The bending members 110-1 and 110-2 may be similar to or same as the bending member 110 discussed previously. The wafer chuck 104 may have two long edges 104a and two short edges 104b. In some embodiments, the bending members 110-1 and 110-2 form a line parallel to the short edges 104b. The bonding tool 500 includes two sets of vacuum holes 106. In some embodiments, the bending members 110-1 and 110-2 form a line parallel to the vacuum holes 106. In some embodiments, with an increased number of the bending members 110-1 and 110-2, the progressive bonding will proceed in the direction parallel to the long edges 104a to achieve less chances of voids and/or gas pockets at the bonding interface between the bonding surfaces of the semiconductor die 302 and the semiconductor wafer 304. In other words, with an increased number of the bending members, the bonding performance may be further elevated.

Figure 6B:
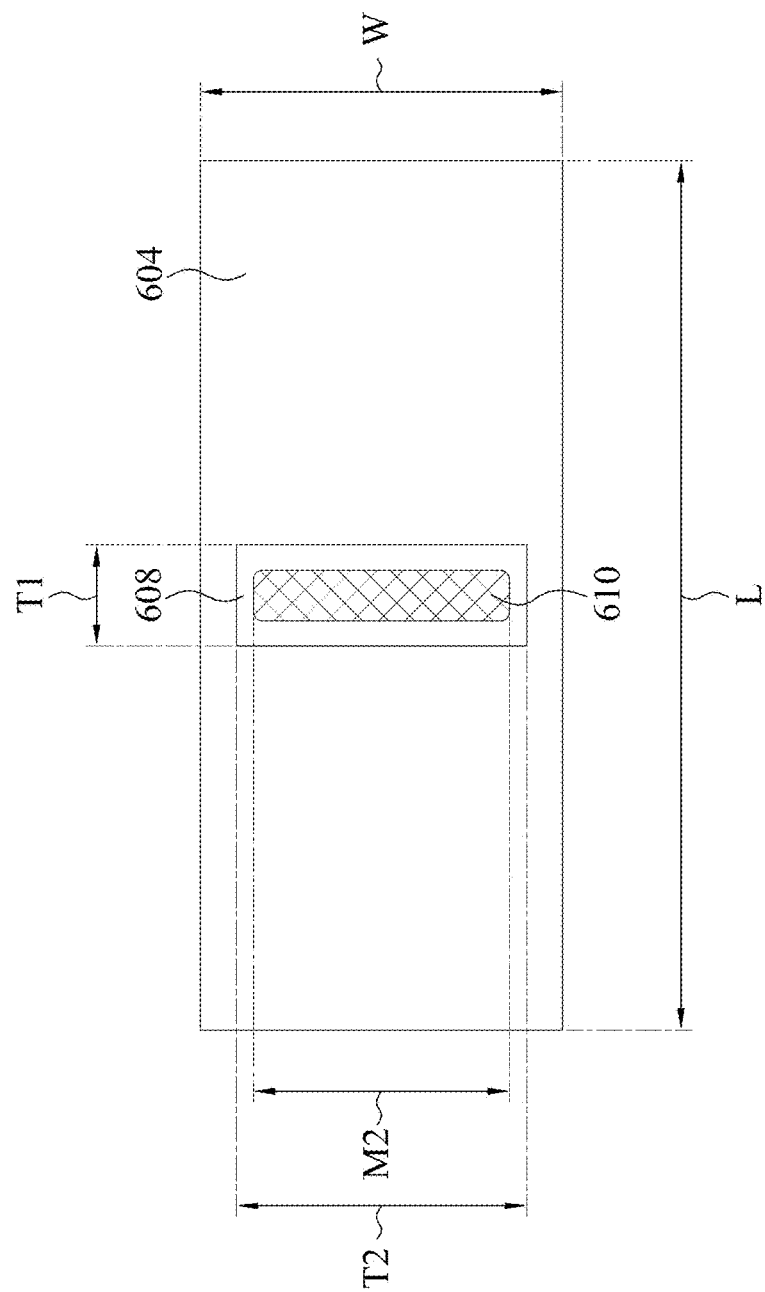
Figure 6C:
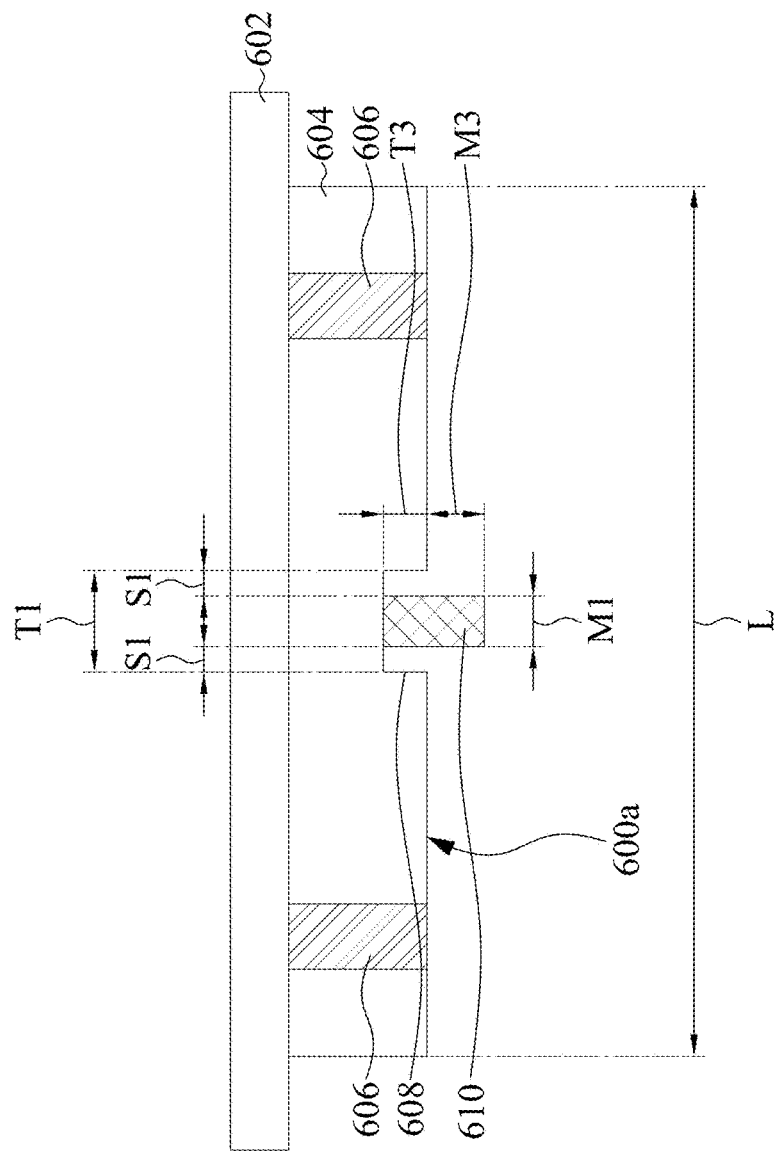

FIGS. 6A to 6C are schematic views of a bonding tool 600 according to aspects of one or more embodiments of the present disclosure. FIG. 6A is a top view of the bonding tool 600, FIG. 6B is an enlarged top view of the bonding tool 600, and FIG. 6C is an enlarged cross-sectional view of the bonding tool 600.

Referring to FIG. 6A, the bonding tool 600 may be similar to the bonding tool 100 in many aspects. The bonding tool 600 includes a stage 602, a wafer chuck 604 and vacuum holes 606. The stage 602, the wafer chuck 604, and the vacuum holes 606 may respectively be similar to or same as the stage 102, the wafer chuck 104, and the vacuum holes 106 discussed previously.

Referring to FIGS. 6B and 6C, the bonding tool 600 further includes a trench 608 and a bending member 610. In some embodiments, the bending member 610 is partially disposed in the trench 608. The bending member 610 may be movably arranged in the trench 608. For example, the bending member 610 protrudes from the first surface 600a in its normal shape (unstrained shape). In addition, when the bending member 610 is in its strained shape, a top surface of the bending member 610 is substantially level with or lower than the first surface 600a. In some embodiments, the bending member 610 is configured to exert a bending force upon a workpiece, e.g., the semiconductor die 302. The bonding tool 600 includes a first surface 600a. In some embodiments, the bending member 610 protrudes from the first surface 600a. The bending member 610 is disposed in a central region of the first surface 600a. The bending member 610, which may also be referred to as a bend-inducing member, is configured to bend an object. In some embodiments, the bending member 610 includes an elastic tape. In some embodiments, a coefficient of elasticity is in a range from about 0.05 Mpa to about 0.5 Mpa.

The trench 608 may have a width T1, a length T2 and a depth T3. The bending member 610 may have a width M1, a length M2 and a protrusion distance M3. A spacing S1 may be between the trench 608 and the bending member 610. The spacing S1 may be configured to accommodate the bending member 610 in its strained shape. The wafer chuck 604 may have a width W and a length L. In some embodiments, a size of the trench 608 is greater than or substantially equal to a size of the bending member 610. In some embodiments, the width T1 is substantially greater than about 1.5 mm. In some embodiments, the width T1 is greater than the width M1. In some embodiments, the width M1 is greater than about 0.5 mm. In some embodiments, one half of the length L is greater than the width T1. In some embodiments, the depth T3 is greater than or substantially equal to twice the protrusion distance M3. In some embodiments, the protrusion distance M3 is greater than 5 micrometers (μ). In some embodiments, the width M1 is greater than or substantially equal to twice the spacing S1. In some embodiments, the width W is greater than the length T2, and the length T2 is greater than the length M2.

FIGS. 7A to 7D are cross-sectional views illustrating a process of die-to-wafer alignment and bonding at different stages according to aspects of one or more embodiments of the present disclosure.

Figure 7A:
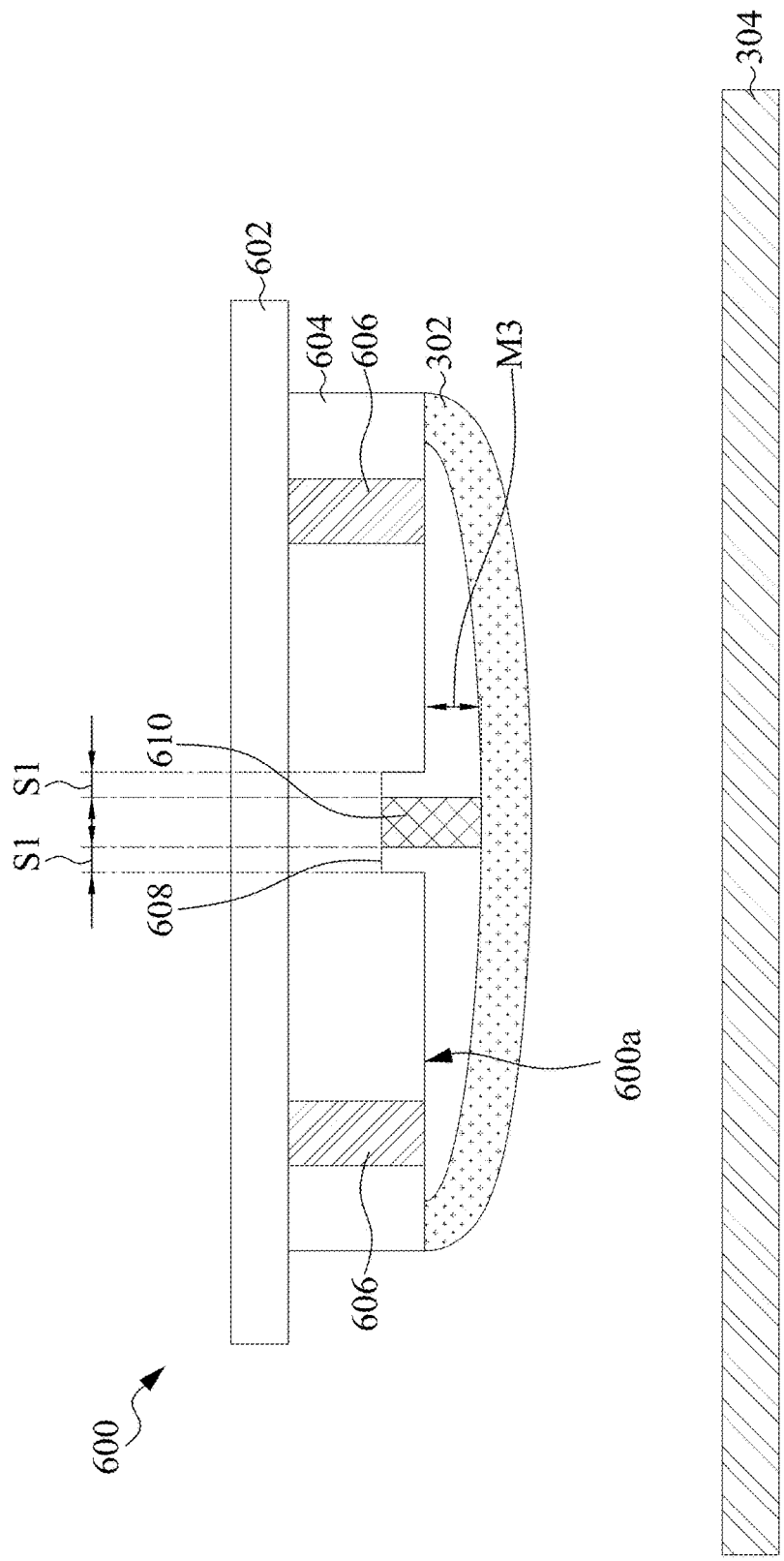
FIGS. 7A to 7D are cross-sectional views illustrating a process of die-to-wafer alignment and bonding at different stages according to aspects of one or more embodiments of the present disclosure.

Referring to FIG. 7A, the semiconductor die 302 is attached to the bonding tool 600. The respective step is described as operation 202 of the method 200 in FIG. 2. The semiconductor die 302 is placed and secured on the first surface 600a. A vacuum system may be coupled to the bonding tool 600 and may be used to secure the semiconductor die 302. For example, the vacuum holes 606 are located on the first surface 600a such that a pressure differential may be applied to a back (e.g., non-bonding) surface of the semiconductor die 302. The semiconductor die 302 may be secured to the bonding tool 600 such that the semiconductor die 302 conforms to the first surface 600a and the bending member 610 through an elastic deformation or deflection. The bending member 610 protrudes from the first surface 600a, causing the semiconductor die 302 to deflect or deform. In some embodiments, the bending member 610 is maintained in its unstrained shape (i.e., protruding from the first surface 600a) during the attachment of the semiconductor die 302 to the bonding tool 600.

Still referring to FIG. 7A, the semiconductor die 302 is aligned with the semiconductor wafer 304 below the semiconductor die 302. The respective step is described as operation 204 of the method 200 in FIG. 2. In some embodiments, the semiconductor die 302 is aligned with the semiconductor wafer 304 through an optical alignment operation, as discussed with respect to FIGS. 4A and 4B. In some embodiments, the bending member 610 protrudes from the first surface 600a by a distance M3 at this stage.

Figure 7B:
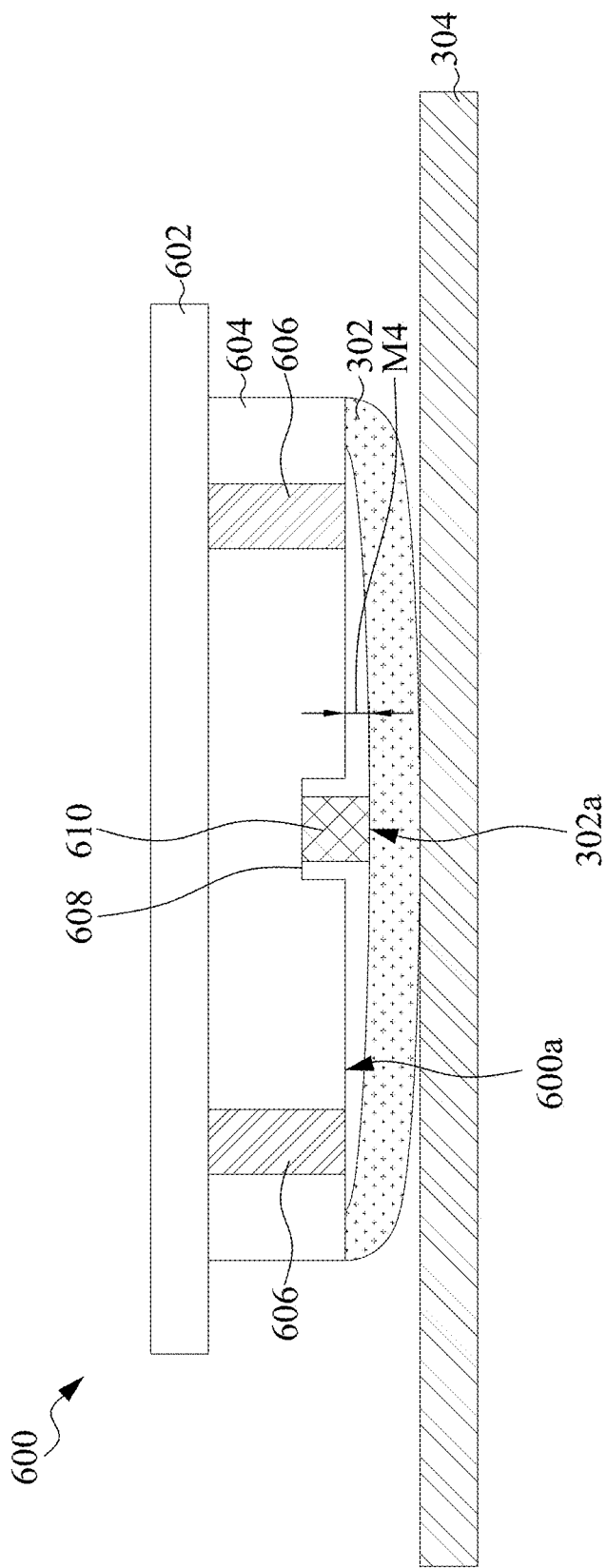

Referring to FIG. 7B, the semiconductor die 302 is moved toward the semiconductor wafer 304 to cause a deformation of the bending member 610 and a partial bonding at a portion 302a of the semiconductor die 302 and the semiconductor wafer 304. The respective step is described as operation 206 of the method 200 in FIG. 2. In some embodiments, the bending member 610 protrudes or extends from the first surface 600a, causing the bonding surfaces of the semiconductor die 302 and the semiconductor wafer 304 to come into contact. The semiconductor die 302 contacts the semiconductor wafer 304 while the semiconductor wafer 304 is substantially flat. Furthermore, the semiconductor die 302 contacts the semiconductor wafer 304 while the semiconductor die 302 is deflected by the bending member 610. Accordingly, the semiconductor die 302 and the semiconductor wafer 304 initially brought into contact while the semiconductor die 302 is deflected and the semiconductor wafer 304 is substantially flat.

In some embodiments, a partial bonding is caused or formed between the portion 302a of the semiconductor die 302 and the semiconductor wafer 304. The portion 302a may overlap the bending member 610 from a top-view perspective. Once the bonding is initiated, a bond wave (i.e., progressive attachment, progressive bonding) between the bonding surfaces may propagate outwardly. In some embodiments, the bending member 610 is retracted during the operation. The bending member 610 may be deformed by the retraction. In some embodiments, the bending member 610 is deformed and extends laterally in the trench 608. The bending member 610 may extend laterally in the spacing S1. In some embodiments, the bending member 610 protrudes from the first surface 600a by a distance M4 at this stage. The distance M4 is less than the distance M3 in the previous stage.

Figure 7C:
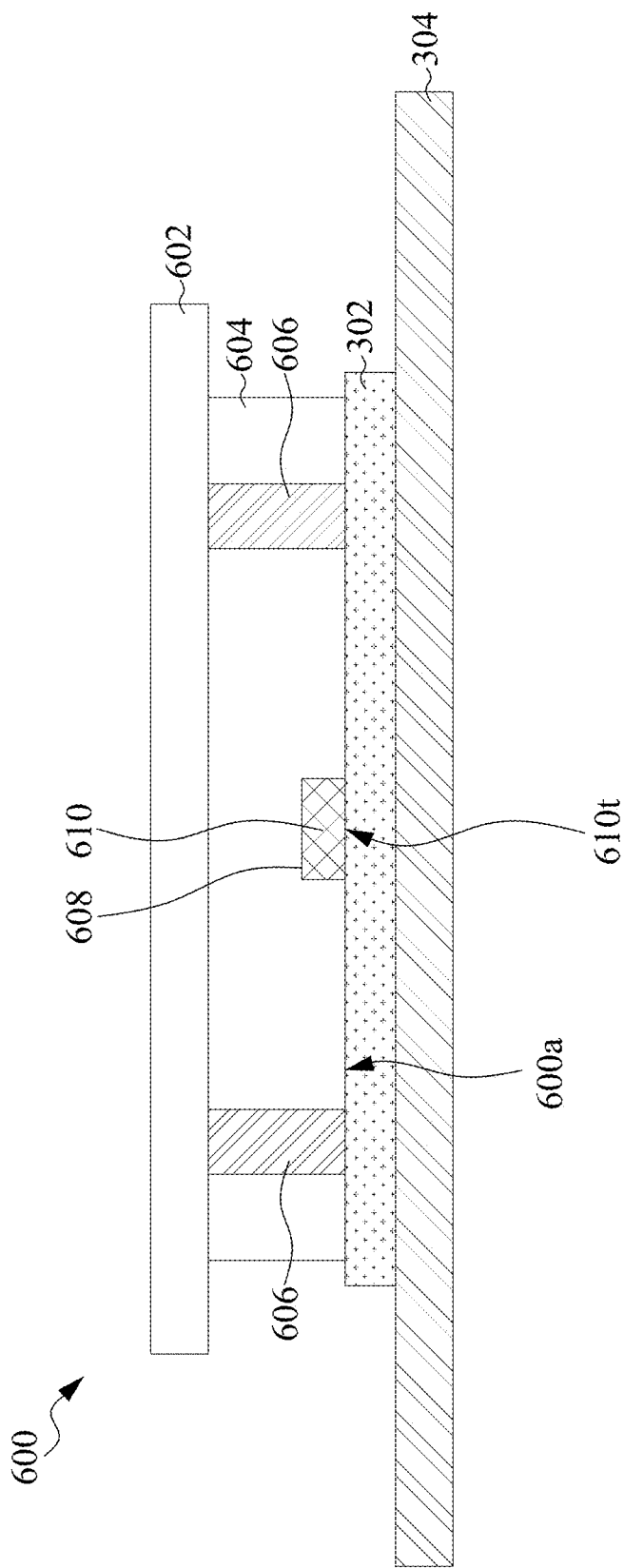

Referring to FIG. 7C, a full bonding is caused between the semiconductor die 302 and the semiconductor wafer 304 subsequent to the partial bonding. The respective step is described as operation 208 of the method 200 in FIG. 2. Once the semiconductor die 302 and the semiconductor wafer 304 are in contact, the bonding tool 600 is used to apply a pressure between the semiconductor die 302 and the semiconductor wafer 304. As the pressure is applied to the semiconductor die 302 and the semiconductor wafer 304, the semiconductor die 302 and the semiconductor wafer 304 bond together at each point where the semiconductor die 302 comes into contact with the semiconductor wafer 304. Because the semiconductor die 302 is deflected (or deformed) during the previous stage, the pressure causes the bonding to proceed progressively from the portion 302a towards the edges of the semiconductor die 302. The semiconductor die 302 may return to its natural form, such as a planar die, during the full bonding.

Due to the contact of the bonding surfaces in center areas and the outward propagation of the bond wave, voids and/or gas pockets may be avoided at the bonding interface between the bonding surfaces of the semiconductor die 302 and the semiconductor wafer 304. In some embodiments, the bending member 610 continues to be retracted during the operation of the full bonding. In some embodiments, a top surface 610t of the bending member 610 is substantially level with the first surface 600a at this stage. In some embodiments, the trench 608 is completely filled by the bending member 610 at this stage.

Figure 7D:
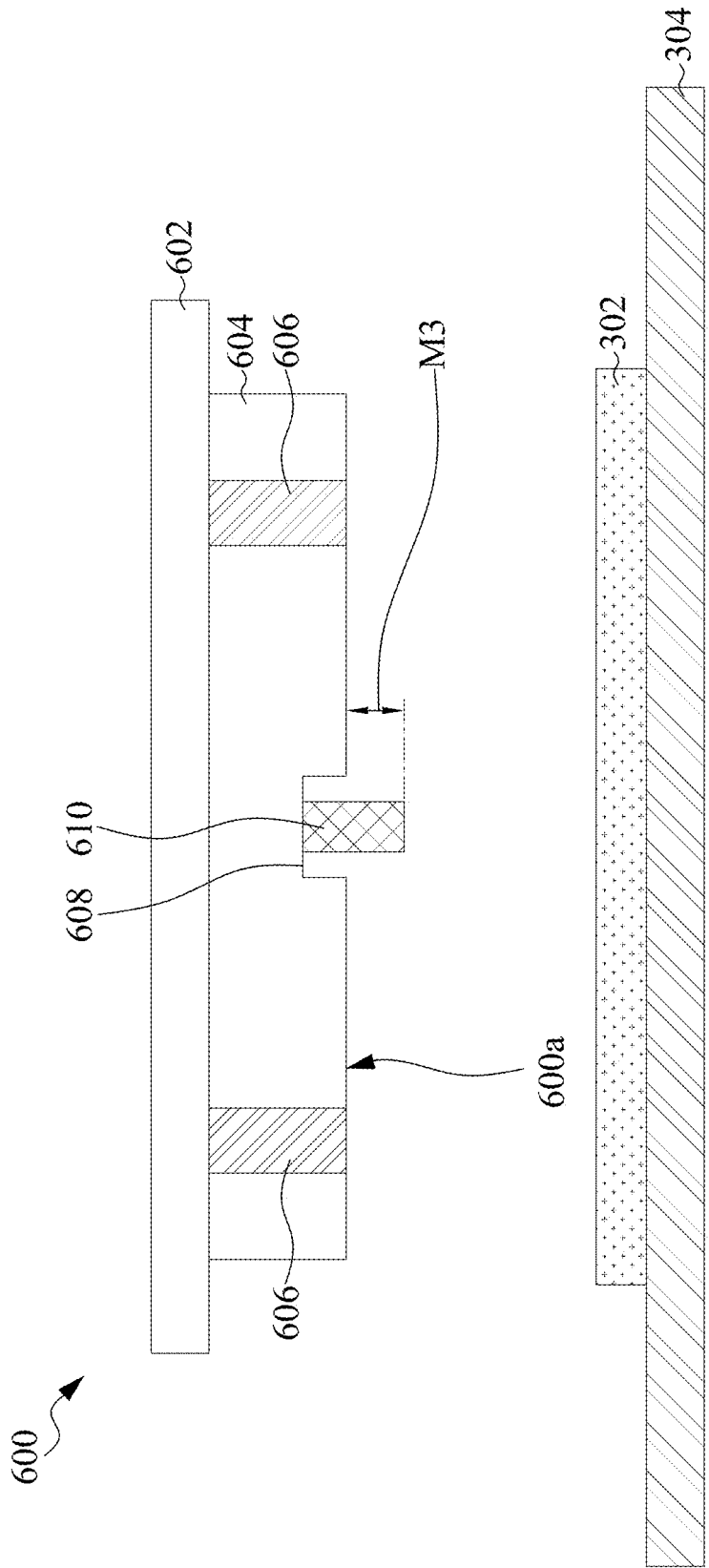

Referring to FIG. 7D, the semiconductor die 302 is released from the bonding tool 600. In some embodiments, the suction or pressure differential caused by respective vacuum system may be removed. Once the semiconductor die 302 is released, the bending member 610 may be released back to its natural shape, such as its unstrained shape. In some embodiments, the bending member 610 may be released to protrude from the first surface 600a by the distance M3 at this stage. In other words, the bending member 610 is restored to an initial shape after the releasing.

The proposed method for bonding the semiconductor die and the semiconductor wafer provides advantages. In some scenarios where the semiconductor die 302 is secured or held by a bonding tool without the bending member 610, a large variation of the sensing current is observed, indicating a non-uniform bonding pressure distribution on the semiconductor die 302. By bonding the semiconductor die 302 by help of the bending member 610, a smaller variation of the sensing current is observed. In other words, the deflection or deformation of the semiconductor die 302 allows an initial contact with a much less contact area between the center area of the semiconductor die 302 and the semiconductor wafer 304, which can ensure a more uniform bonding pressure distribution on the semiconductor die 302. Hence, voids and/or gas pockets may be avoided at the interface between the bonding surfaces of the semiconductor die 302 and the semiconductor wafer 304, and the performance of bonding may be elevated.

Figure 8:
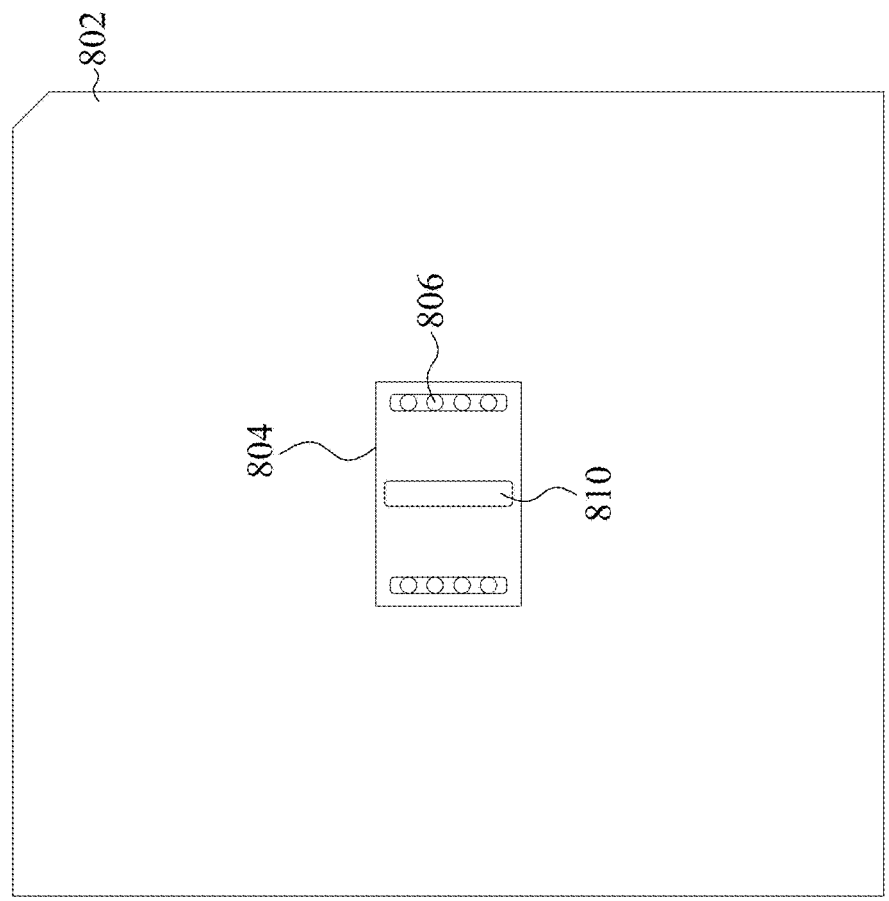
FIG. 8 is a top view of a bonding tool according to aspects of one or more embodiments of the present disclosure.

FIG. 8 is a top view of a bonding tool 800 according to aspects of one or more embodiments of the present disclosure. Referring to FIG. 8, the bonding tool 800 may be similar to the bonding tool 600 in many aspects. The bonding tool 800 includes a stage 802, a wafer chuck 804, vacuum holes 806 and a bending member 810. Different from the bonding tool 600, the wafer chuck 804 of the bonding tool 800 is located at a center of the stage 802. In some embodiments, the wafer chuck 804 is surrounded by the stage 802. The location of the wafer chuck 804 may be designed according to different product requirements.

In accordance with some embodiments of the present disclosure, a method is provided. The method includes attaching a semiconductor die to a bonding tool having a first surface, wherein the bonding tool comprises a bending member movably arranged in a trench of the bonding tool, and wherein the bending member protrudes from the first surface and bends the semiconductor die; aligning the semiconductor die with a semiconductor wafer below the semiconductor die; moving the semiconductor die toward the semiconductor wafer to cause a retraction of the bending member and a partial bonding at a portion of the semiconductor die and the semiconductor wafer, the portion overlapping the bending member from a top-view perspective; and causing a full bonding between the semiconductor die and the semiconductor wafer subsequent to the partial bonding.

In accordance with some embodiments of the present disclosure, a method is provided. The method includes receiving a bonding tool having a first surface and a bending member protruding from the first surface; causing a semiconductor die to deflect by contacting the bending member with the semiconductor die; moving the semiconductor die toward a semiconductor wafer, wherein the semiconductor wafer has a flat surface facing the semiconductor die; and contacting the semiconductor die with the semiconductor wafer while the semiconductor die is deflected and the semiconductor wafer is substantially flat, the contacting of the semiconductor die with the semiconductor wafer causing the bending member to retract from the first surface.

In accordance with some embodiments of the present disclosure, a bonding tool is provided. The semiconductor structure includes a wafer chuck having a first surface configured to engage a semiconductor die, wherein the wafer chuck comprises a trench located in a central region of the first surface; a bending member disposed in the trench, wherein the bending member is configured to protrude from the first surface to bend the semiconductor die before a bonding, and the bending member is configured to retract to the trench during or after the bonding; and a plurality of vacuum holes disposed in a peripheral region of the first surface, wherein the plurality of vacuum holes are configured to secure the semiconductor die.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
attaching a semiconductor die to a bonding tool having a first surface, wherein the bonding tool comprises a plurality of vacuum holes and a bending member movably arranged in a trench of the bonding tool, wherein the plurality of vacuum holes provide a vacuum force to hold the semiconductor die, and the bending member protrudes from the first surface and bends the semiconductor die;
causing a partial bonding at a portion of the semiconductor die and a semiconductor wafer, the portion overlapping the bending member from a top-view perspective;
causing a full bonding between the semiconductor die and the semiconductor wafer subsequent to the partial bonding while keeping the vacuum force to hold the semiconductor die at the same time; and
releasing the semiconductor die from the bonding tool by removing the vacuum force subsequent to the full bonding.

2. The method of claim 1, wherein the portion of the semiconductor die is a central portion of the semiconductor die.

3. The method of claim 1, wherein the plurality of vacuum holes are disposed in a peripheral region of the first surface and laterally surround the bending member.

4. The method of claim 1, wherein a top surface of the bending member is substantially level with the first surface during the full bonding.

5. The method of claim 1, wherein the bending member protrudes from the first surface of the bonding tool by a first distance during the attaching of the semiconductor die to the bonding tool, the bending member protrudes from the first surface of the bonding tool by a second distance during the partial bonding, and the second distance is less than the first distance.

6. The method of claim 1, wherein the semiconductor die is substantially flat during or after the full bonding.

7. The method of claim 1, further comprising monitoring a pressure between the semiconductor die and the semiconductor wafer during the partial bonding.

8. The method of claim 7, further comprising stopping the partial bonding in response to the pressure exceeding a predetermined range.

9. The method of claim 1, further comprising monitoring a sensing current associated with a bonding pressure between the semiconductor die and the semiconductor wafer during the partial bonding.

10. A method, comprising:
receiving a bonding tool having a first surface and a bending member protruding from the first surface;
attaching a semiconductor die to the bonding tool and applying a vacuum force to hold a periphery region of the semiconductor die, wherein the semiconductor die is deformed by a protrusion of the bending member and the vacuum force of the bonding tool;
contacting the semiconductor die with a semiconductor wafer, the contacting of the semiconductor die with the semiconductor wafer causing the bending member to retract toward the first surface;
causing a full bonding between the semiconductor die and the semiconductor wafer while keeping the vacuum force to hold the semiconductor die at the same time; and
releasing the semiconductor die from the bonding tool by removing the vacuum force subsequent to the full bonding.

11. The method of claim 10, wherein the bonding tool includes a trench and the bending member is partially disposed in the trench before the bonding.

12. The method of claim 11, wherein the bending member is completely disposed in the trench during the full bonding.

13. The method of claim 11, wherein the bending member protrudes from the first surface of the bonding tool by a first distance before and during the attaching of the semiconductor die to the bonding tool, the bending member protrudes from the first surface of the bonding tool by a second distance during the contacting of the semiconductor die with the semiconductor wafer, and the second distance is less than the first distance.

14. The method of claim 10, wherein the bending member is restored to an initial form after the releasing.

15. The method of claim 10, further comprising:
monitoring a bonding profile to detect whether a bonding failure occurs.

16. A method, comprising:
receiving a bonding tool comprising a bending member and a wafer chuck, wherein the wafer chuck comprises a trench and a vacuum hole, and the bending member is movably arranged in the trench and protrudes from a first surface of the bonding tool;
attaching a semiconductor die to the bonding tool by exerting a vacuum force through the vacuum hole, wherein the semiconductor die is deformed by a protrusion of the bending member and the vacuum force from the bonding tool;
contacting the semiconductor die to a semiconductor wafer to push the bending member into a retracted position;
causing a full bonding between the semiconductor die and the semiconductor wafer while keeping the vacuum force to hold the semiconductor die at the same time; and
releasing the semiconductor die from the bonding tool by removing the vacuum force subsequent to the full bonding.

17. The method of claim 16, wherein a top surface of the bending member is substantially level with the first surface during the full bonding.

18. The method of claim 16, further comprising:
applying a bonding pressure between the semiconductor die and the semiconductor wafer once the semiconductor die and the semiconductor wafer are in full contact.

19. The method of claim 16, wherein the vacuum hole is disposed in a peripheral region of the first surface.

20. The method of claim 16, wherein the bending member protrudes from the first surface of the bonding tool by a first distance before the attaching of the semiconductor die to the bonding tool and after the semiconductor die is released from the bonding tool, and the bending member in the retracted position protrudes from the first surface of the bonding tool by a second distance less than the first distance.

* * * * *